(12) United States Patent
Serrai et al.

(10) Patent No.: US 10,809,334 B2
(45) Date of Patent: Oct. 20, 2020

(54) NUCLEAR MAGNETIC RESONANCE SPECTROSCOPY

(71) Applicant: UNIVERSITEIT GENT, Ghent (BE)

(72) Inventors: Hacene Serrai, London (CA); Eric Achten, Ghent (BE); Sourav Bhaduri, Ghent (BE)

(73) Assignee: UNIVERSITEIT GENT, Ghent (BE)

( * ) Notice: Subject to any disclaimer, the term of this patent is extended or adjusted under 35 U.S.C. 154(b) by 0 days.

(21) Appl. No.: 16/331,687

(22) PCT Filed: Jun. 23, 2017

(86) PCT No.: PCT/EP2017/065571
§ 371 (c)(1),
(2) Date: Mar. 8, 2019

(87) PCT Pub. No.: WO2018/050306
PCT Pub. Date: Mar. 22, 2018

(65) Prior Publication Data
US 2019/0195974 A1    Jun. 27, 2019

(30) Foreign Application Priority Data
Sep. 13, 2016   (EP) .................................. 16188475

(51) Int. Cl.
*G01R 33/485*  (2006.01)
*G01R 33/565*  (2006.01)
(Continued)

(52) U.S. Cl.
CPC ....... *G01R 33/485* (2013.01); *G01R 33/5608* (2013.01); *G01R 33/56509* (2013.01); *G01R 33/56527* (2013.01); *G01R 33/483* (2013.01)

(58) Field of Classification Search
CPC .............. G01R 33/485; G01R 33/5608; G01R 33/56509; G01R 33/56527; G01R 33/483
See application file for complete search history.

(56) References Cited

U.S. PATENT DOCUMENTS 4,698,592 A    10/1987  Feinberg
4,899,109 A *  2/1990   Tropp ................ G01R 33/3875
                                                              324/319

(Continued)

OTHER PUBLICATIONS

Barkhuijsen et al., "Retrieval of Frequencies, Amplitudes, Damping Factors, and Phases from Time-Domain Signals Using a Linear Least-Squares Procedure," Journal of Magnetic Resonance, vol. 61, 1985, pp. 465-481.

(Continued)

*Primary Examiner* — G. M. A Hyder
(74) *Attorney, Agent, or Firm* — Workman Nydegger

(57) ABSTRACT

A method is provided for performing NMR spectroscopy. The method comprises positioning a sample in a homogeneous stationary magnetic field directed along an axis, preparing nuclei in at least a predetermined volume of the sample for resonant emission of an NMR signal and creating this NMR signal. This comprises irradiating the sample with at least one RF excitation pulse in accordance with an MRI sequence preparation and/or evolution module. The method also comprises sensing the NMR signal in the absence of frequency encoding magnetic field gradients such that analysis of the NMR signal yields a chemical shift spectrum from the nuclei. During this sensing, a plurality of intermittently blipped phase gradient pulses are applied to incrementally shift a position in k-space such that different time segments of the NMR signal, demarcated by the blipped phase gradient pulses, correspond to different predetermined locations in k-space.

20 Claims, 14 Drawing Sheets

(51) Int. Cl.
*G01R 33/56* (2006.01)
*G01R 33/483* (2006.01)

(56) References Cited

U.S. PATENT DOCUMENTS

| | | | | |
|---|---|---|---|---|
| 5,570,020 | A * | 10/1996 | Bornert | G01R 33/56554 324/309 |
| 5,572,124 | A * | 11/1996 | Bito | G01R 33/4828 324/307 |
| 6,043,652 | A * | 3/2000 | Liu | G01R 33/5615 324/309 |
| 2010/0036235 | A1* | 2/2010 | Lamerichs | G01R 33/485 600/410 |
| 2012/0313641 | A1* | 12/2012 | Labadie | G01R 33/4818 324/309 |
| 2013/0278254 | A1* | 10/2013 | Reeder | G01R 33/485 324/307 |
| 2015/0204957 | A1* | 7/2015 | Smith | G01R 33/446 324/309 |

OTHER PUBLICATIONS

Fu et al., "High Speed Magnetic Resonance Spectroscopic Imaging Using Wavelet Encoding and Parallel Imaging," International Society for Magnetic Resonance in Medicine, vol. 16, 2008, p. 1582.

Lin et al., "A Novel Detection—Estimation Scheme for Noisy NMR Signals: Applications to Delayed Acquisition Data," Journal of Magnetic Resonance, vol. 128, 1997, pp. 30-41.

Lin et al., "Sensitivity-Encoded (SENSE) Proton Echo-Planar Spectroscopic Imaging (PEPSI) in the Human Brain," Magnetic Resonance in Medicine, vol. 57, 2007, pp. 249-257.

Tomczak et al., "A Subband ARMA Modeling Approach to High-Resolution NMR Spectroscopy," Journal of Magnetic Resonance, vol. 158, 2002, pp. 86-98.

Uchiyama et al., "In Vivo Potassium-39 NMR Spectra by the Burg Maximum-Entropy Method," Journal of Magnetic Resonance, vol. 94, 1991, pp. 449-454.

Extended European Search Report from EP Application No. 16188475.4, dated Feb. 28, 2017.

International Search Report and Written Opinion from PCT Application No. PCT/EP2017/065571, dated Sep. 11, 2017.

* cited by examiner 401      402

NUCLEAR MAGNETIC RESONANCE SPECTROSCOPY

FIELD OF THE INVENTION

The invention relates to the field of nuclear magnetic resonance spectroscopy. More specifically it relates to a device and method for nuclear magnetic resonance spectroscopy.

BACKGROUND OF THE INVENTION

Magnetic resonance spectroscopy (MRS) is a useful technique known in the art for characterizing a chemical composition of a sample. For example, MRS can be applied for non-invasive and ionizing radiation free study of the metabolism, e.g. in vivo, for example to detect the presence and/or to quantify a concentration of a metabolite of interest. Magnetic Resonance Spectroscopic Imaging (MRSI) may be used, for example, for obtaining tissue metabolite images in-vivo. The acquired metabolic information may be used to evaluate tissue function and accurately assess its chemical alterations.

In magnetic resonance spectroscopy, chemical shift information is collected from a volume of interest in the sample using excitation and detection of magnetic resonance, e.g. using techniques similar to conventional magnetic resonance imaging. Such chemical shifts occur when the nuclear magnetic resonance frequencies, i.e. the Larmor frequency, of resonant nuclei of the same type in a molecule are affected by local magnetic differences due to a different chemical context, e.g. a different shielding of the nucleus by the local electron cloud configuration. The chemical shift spectrum of a particular molecule may thus be identified and distinguished from other molecules.

Chemical shift signals can be detected from a sample as a whole, or may be detected in a spatially sensitive manner, e.g. to perform localized chemical shift spectroscopy and/or chemical shift imaging.

For example, magnetic field gradients may be used to select a small volume for chemical shift spectrum collection. Furthermore, time-dependent gradient magnetic fields may be applied in the presence of a sequence of radio frequency (RF) excitation pulses, as is known in the art, to scan over the volume of interest.

In chemical shift imaging (CSI), a well known technique in the art, phase-encoding gradients are activated to achieve spatial encoding of tissue information prior to the collection of an echo signal. Chemical shift information is thus collected by dis-activating the readout gradient and using phase encoding gradients to encode the spatial dimensions. Thus, a multi-voxel technique is provided that allows for measurement of larger volumes of tissue that can be divided into smaller voxels during the processing period. By performing numerous field gradient activations, i.e. phase encoding steps, many phase encoded MR signals may be acquired, each one filling one point in the k-space domain. A Fourier transform can be performed on the k-space data to obtain metabolite maps, e.g. metabolite images that may have a good signal-to-noise ratio (SNR) and high spectral and spatial resolution. However, since each encoding step requires the generation of another echo signal, this method may have the disadvantage of requiring long acquisition times. Thus, in MRSI, a two-dimensional CSI method may be applied, e.g. at the cost of longer acquisition and processing time.

To overcome this limitation, other spectroscopic imaging methods have been proposed. These methods include non-Fourier encoding such as Hadamard and Wavelet encoding, or high speed imaging techniques such as echo planar spectroscopic imaging (EPI) and spiral, fast spin echo (FSE) and echo-shift methods. In contrast to CSI, which uses only phase encoding gradients to perform the encoding and obtain metabolite maps, non-Fourier methods may use RF pulse shape manipulation, and the high speed methods may, generally, use the readout gradients to reduce acquisition time and achieve the same task. To further reduce acquisition time, some of the mentioned techniques have been combined with the well-known parallel imaging (PI) method, e.g. WEPI and PEPSI.

In proton-echo planar spectroscopic imaging (PEPSI), as known in the art, a readout gradient is activated in a zig-zag manner, and the chemical shift information is collected from the decay of the echo signal during the zig-zag gradient activation. While this method may have the advantage of allowing a fast acquisition, the generated data may suffer from image artifacts and reduced chemical shift information due to the fast zig-zag gradients and may allow only the sampling of a small number of points per acquired echo.

Preferably, speeding up data acquisition should occur while maintained the SNR. Unfortunately, the rapidity in data acquisition gained by high speed MRSI methods is usually associated with a penalty of signal-to-noise ratio (SNR) reduction or data artefacts requiring the usage of complex solutions.

SUMMARY OF THE INVENTION

It is an object of embodiments of the present invention to provide good and efficient means and method for performing nuclear magnetic resonance spectroscopy.

The above objective is accomplished by a method and device according to the present invention.

It is an advantage of embodiments of the present invention that short acquisition times can be achieved in NMR spectroscopy, e.g. in magnetic resonance spectroscopic imaging, such as in chemical shift imaging.

It is a further advantage of embodiments of the present invention that motion artefacts can be reduced.

It is an advantage of embodiments that multiple points in k-space, and hence multiple voxel locations, can be acquired from a single NMR signal, e.g. created by a single preparation-evolution module of excitation and/or refocusing prior to the signal sensing.

It is an advantage of embodiments of the present invention that image artefacts and/or deteriorated chemical shift information can be prevented or reduced since no readout gradients are applied during sensing, e.g. oscillating gradients or zig-zag gradients as applied in prior art methods such as proton echo planar spectroscopic imaging.

It is an advantage of embodiments of the present invention that acquisition times can be reduced, e.g. with respect to an MRS method known in the art, when collecting metabolite information, e.g. in-vivo collection of tissue metabolite information, using magnetic resonance spectroscopic imaging in one, two or three dimensions. For example, patient comfort may be improved during an MRI-MRS exam.

It is an advantage of embodiments of the present invention that localized NMR spectroscopy can be achieved in which a range of sampled positions of the sensitive volume of interest is easily selectable.

In a first aspect, the present invention relates to a method for performing nuclear magnetic resonance spectroscopy. This method comprises the steps of positioning a sample in a homogeneous stationary magnetic field directed along an axis. The method also comprises preparing nuclei in at least a predetermined volume of the sample for resonant emission of an NMR signal and creating the NMR signal. This preparing and creating comprises irradiating the sample with at least one radio-frequency excitation pulse in accordance with an MRI sequence preparation module and/or an MRI sequence evolution module. The method further comprises sensing the NMR signal in the absence of frequency encoding magnetic field gradients such that analysis of the NMR signal yields a chemical shift spectrum from the nuclei. During the sensing, a plurality of intermittently blipped phase gradient pulses are applied to incrementally shift a position in k-space such that different time segments of the NMR signal correspond to different predetermined locations in k-space, in which these time segments are demarcated by the blipped phase gradient pulses.

In a method in accordance with embodiments of the present invention, each of the plurality of intermittently blipped gradient pulses may have a pulse width in the range of 1 µs to 10 µs, e.g. in the range of 2 µs to 6 µs, e.g. 3 µs to 5 µs, e.g. 4 µs.

In a method in accordance with embodiments of the present invention, the plurality of intermittently blipped gradient pulses may have a same pulse amplitude.

In a method in accordance with embodiments of the present invention, the plurality of intermittently blipped gradient pulses may be generated by activating the phase gradient at regular time intervals.

In a method in accordance with embodiments of the present invention, the plurality of intermittently blipped gradient pulses may be spaced apart in time at regular time intervals, said time interval being smaller than a fourth of the duration of said NMR signal.

In a method in accordance with embodiments of the present invention, preparing of the at least one predetermined volume in the sample may comprise irradiating the sample with at least one radio-frequency excitation pulse in accordance with an MRI sequence preparation module to prepare the at least one predetermined volume in the form of a predetermined imaging slice.

It is an advantage of embodiments of the present invention that efficient spectroscopic 2D imaging in a slice, or 3D imaging by iterating over a plurality of slices, can be obtained by isolating nuclear spins in a planar slice of the sample.

In a method in accordance with embodiments of the present invention, creating of the NMR signal may comprise irradiating the sample with at least one radio-frequency refocusing pulse in accordance with an MRI sequence evolution module so as to invert spins of the nuclei, thereby creating the NMR signal in the form of at least part of an echo signal, e.g. a spin echo signal or a decaying half of an echo signal.

It is an advantage of embodiments of the present invention that multiple points in k-space, and hence multiple voxel locations, can be acquired from a single spin echo signal. A larger number of encoding steps can be achieved than the number of echo signals that are generated, e.g. the number of encoding steps may be a multiple of the number of generated echo signals.

In a method in accordance with embodiments of the present invention, the steps of preparing and/or creating may comprise irradiating the sample with at least three selective radiofrequency pulses while simultaneously applying magnetic field gradients, such as to select the predetermined volume at a predetermined location in the sample in accordance with a point resolved spectroscopy (PRESS) or stimulated echo acquisition mode (STEAM) MRI sequence.

A method in accordance with embodiments of the present invention may further comprise applying a further blipped phase gradient pulse, before creating the NMR signal, to shift a k-space location corresponding to the first sensed time segment of the plurality of time segments to a peripheral region of k-space, e.g. to an edge of k-space.

In a method in accordance with embodiments of the present invention, the steps of preparing and/or creating may further comprise applying an MRI sequence module for water signal suppression and/or water signal elimination.

A method in accordance with embodiments of the present invention, may further comprise repeating at least the step of creating the NMR signal to create at least one further NMR signal, e.g. repeating at least the step of creating the NMR signal to create at least one further NMR signal and the step of sensing the at least one further NMR signal, in which the NMR signal and the or each at least one further NMR signal may correspond to a different predetermined volume in the sample.

A method in accordance with embodiments of the present invention may further comprise, for each of the different time segments of the NMR signal, a signal processing step for extending the time segment of the NMR signal in time, e.g. by extrapolation or extension in time, e.g. in a forward and/or a backward sense of time, e.g. such as to obtain an extrapolated, inferred (e.g. based on a fitted model) and/or extended NMR signal representative of the location in k-space corresponding to the time segment. This extrapolated NMR signal may be extrapolated over at least half of the time interval over which the NMR signal, e.g. the entire NMR signal, was sensed.

A method in accordance with embodiments of the present invention may further comprise, for each of the different time segments of the NMR signal, extrapolating the time segment of the NMR signal in a forward and a backward sense of time such as to obtain an extrapolated NMR signal, representative of the location in k-space corresponding to the time segment. This extrapolated NMR signal may be extrapolated over at least half of the time interval over which the NMR signal, e.g. the entire NMR signal, was sensed.

A method in accordance with embodiments of the present invention may further comprise a step of computing a complex conjugate of each of the extrapolated NMR signals to obtain a conjugated extrapolated NMR signal representative of a mirror location in k-space.

It is an advantage of embodiments of the present invention that an efficient operation can be performed to determine a second set of signals in a complimentary k-space region.

A method in accordance with embodiments of the present invention may comprise acquiring a reference signal, e.g. having a length in time longer than each of the time segments, e.g. having a length in time equal to or greater than the length in time of the NMR signal. The reference signal may be acquired at the center of k-space (e.g. where k=0), e.g. without applying the blipped phase gradient pulses during the acquisition of the reference signal.

In a method in accordance with embodiments of the present invention, the step of signal processing may comprise estimating parameters of a predetermined plurality of spectral peaks, e.g. relating to a plurality of metabolites of interest, in which these parameters are substantially constant over the time segments, e.g. other spectral parameters than amplitude, e.g. parameters such as frequency and damping factor, by fitting the reference signal to a signal model representative of the plurality of spectral peaks.

The step of signal processing may further comprise using the estimated parameters to generate a noiseless basis representing the predetermined plurality of spectral peaks, e.g. over a longer time interval than each of the time segments cover individually, e.g. over the full time scale of the NMR signal. The amplitudes of the predetermined spectral peaks may be normalized, e.g. to a predetermined value, such as to unity, in the noiseless basis.

The step of signal processing may further comprise partitioning the basis into time segments of the basis corresponding to the time segments of the NMR signal.

The step of signal processing may further comprise fitting each time segment of the NMR signal to a linear combination of the time segments of the basis to determine complex valued coefficients representative of phase modulated amplitudes of the predetermined spectral peaks for each time segment.

The step of signal processing may further comprise extending each time segment in time, e.g. extrapolating each time segment in time, e.g. in a forward and/or backward sense of time, by using the linear combination of the noiseless basis corresponding to the complex valued coefficients, which were determined for the time segment, as the extended and/or extrapolated time segment.

In a method in accordance with embodiments of the present invention, extrapolating may comprise applying an autoregressive model or generalized autoregressive model to extrapolate the time segment of the NMR segment in the forward sense of time and/or in the backward sense of time.

It is an advantage of embodiments of the present invention that an autoregressive model can provide low pass filtering in the time domain, thus reducing noise in reconstructed spectra.

It is an advantage of embodiments of the present invention that an autoregressive model is a simple and efficient method of extrapolation.

In a method in accordance with embodiments of the present invention, the NMR signal may be an echo signal, and the step of extrapolating may comprise: applying a first autoregressive model to extrapolate the time segment in a time sense away from a time of occurrence of the maximum of the echo signal envelope to produce a first extrapolated signal, and applying a second autoregressive model to extrapolate the first extrapolated signal in a time sense toward the time of occurrence of the maximum of the echo signal. The auto regressive model to extend a time segment in a backward sense towards the maximum of the echo and in a forward sense towards the end of the echo can be the same model or can differ. In a method in accordance with embodiments of the present invention, the order of the autoregressive model may be selected as the order which minimizes an Akaike information criterion, a Bayesian information criterion or an information-theoretic information criterion.

A method in accordance with embodiments of the present invention may further comprise applying a Fourier transform to the time segments, or to the extrapolated NMR signals, of both k-space and time domain dimensions, to provide chemical species spectra as function of spatial location in the sample.

A method in accordance with embodiments of the present invention may further comprise obtaining an image of the sample representative of spatial variations in a chemical constitution of the sample and storing the image in a data storage memory.

In a second aspect, the present invention also relates to a control unit comprising a controller configured for controlling a magnetic resonance scanner such as to perform the steps of a method in accordance with embodiments of the first aspect of the present invention.

In a third aspect, the present invention also relates to a magnetic resonance scanner system, comprising a control unit in accordance with embodiments of the second aspect of the present invention.

Particular and preferred aspects of the invention are set out in the accompanying independent and dependent claims. Features from the dependent claims may be combined with features of the independent claims and with features of other dependent claims as appropriate and not merely as explicitly set out in the claims.

These and other aspects of the invention will be apparent from and elucidated with reference to the embodiment(s) described hereinafter.

BRIEF DESCRIPTION OF THE DRAWINGS

FIG. 13, FIG. 15, FIG. 17 and FIG. 19 correspond to noiseless spectra, while FIG. 14, FIG. 16, FIG. 18 and FIG. 20 correspond to noisy data. FIG. 13 and FIG. 14 correspond to data for a number of phase encoded time segments PE=4, FIG. 15 and FIG. 16 correspond to data for PE=8, FIG. 17 and FIG. 18 correspond to data for PE=16 and FIG. 19 and FIG. 20 correspond to data for PE=32.

FIG. 21 and FIG. 22 correspond to 1D and 2D datasets with PE=8 and R=8 along AP direction, while FIG. 23 and FIG. 24 correspond to 1D and 2D datasets with PE=16 and R=8 along AP direction. For comparison, CSI data is overlayed on top of the RAPID data in the zoomed voxels.

Figure 1:
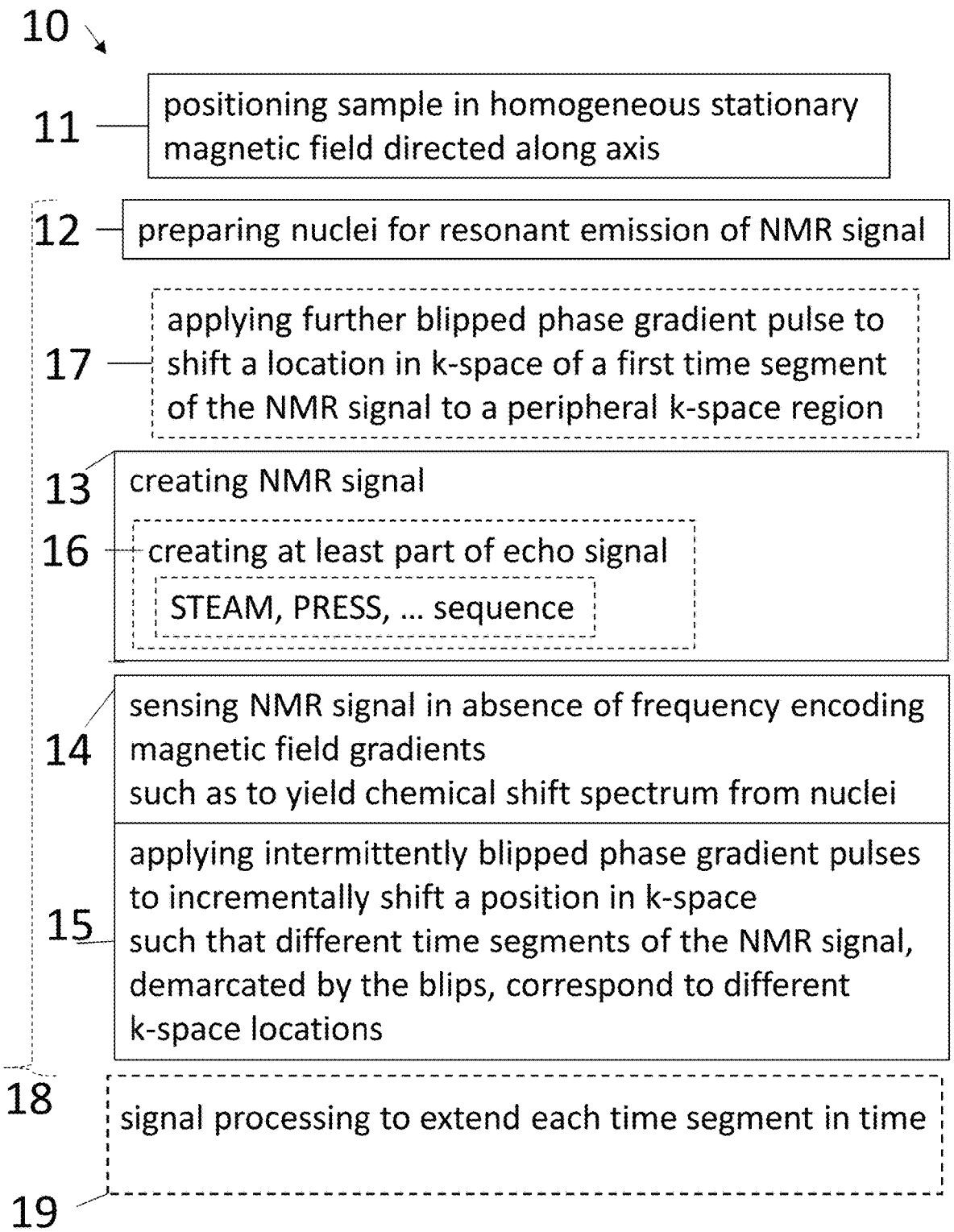
FIG. 1 shows an exemplary method in accordance with embodiments of the present invention.

The drawings are only schematic and are non-limiting. In the drawings, the size of some of the elements may be exaggerated and not drawn on scale for illustrative purposes.

Any reference signs in the claims shall not be construed as limiting the scope.

In the different drawings, the same reference signs refer to the same or analogous elements.

DETAILED DESCRIPTION OF ILLUSTRATIVE EMBODIMENTS

The present invention will be described with respect to particular embodiments and with reference to certain drawings but the invention is not limited thereto but only by the claims. The drawings described are only schematic and are non-limiting. In the drawings, the size of some of the elements may be exaggerated and not drawn on scale for illustrative purposes. The dimensions and the relative dimensions do not correspond to actual reductions to practice of the invention.

Furthermore, the terms first, second and the like in the description and in the claims, are used for distinguishing between similar elements and not necessarily for describing a sequence, either temporally, spatially, in ranking or in any other manner. It is to be understood that the terms so used are interchangeable under appropriate circumstances and that the embodiments of the invention described herein are capable of operation in other sequences than described or illustrated herein.

Moreover, the terms top, under and the like in the description and the claims are used for descriptive purposes and not necessarily for describing relative positions. It is to be understood that the terms so used are interchangeable under appropriate circumstances and that the embodiments of the invention described herein are capable of operation in other orientations than described or illustrated herein.

It is to be noticed that the term "comprising", used in the claims, should not be interpreted as being restricted to the means listed thereafter; it does not exclude other elements or steps. It is thus to be interpreted as specifying the presence of the stated features, integers, steps or components as referred to, but does not preclude the presence or addition of one or more other features, integers, steps or components, or groups thereof. Thus, the scope of the expression "a device comprising means A and B" should not be limited to devices consisting only of components A and B. It means that with respect to the present invention, the only relevant components of the device are A and B.

Reference throughout this specification to "one embodiment" or "an embodiment" means that a particular feature, structure or characteristic described in connection with the embodiment is included in at least one embodiment of the present invention. Thus, appearances of the phrases "in one embodiment" or "in an embodiment" in various places throughout this specification are not necessarily all referring to the same embodiment, but may. Furthermore, the particular features, structures or characteristics may be combined in any suitable manner, as would be apparent to one of ordinary skill in the art from this disclosure, in one or more embodiments.

Similarly it should be appreciated that in the description of exemplary embodiments of the invention, various features of the invention are sometimes grouped together in a single embodiment, figure, or description thereof for the purpose of streamlining the disclosure and aiding in the understanding of one or more of the various inventive aspects. This method of disclosure, however, is not to be interpreted as reflecting an intention that the claimed invention requires more features than are expressly recited in each claim. Rather, as the following claims reflect, inventive aspects lie in less than all features of a single foregoing disclosed embodiment. Thus, the claims following the detailed description are hereby expressly incorporated into this detailed description, with each claim standing on its own as a separate embodiment of this invention.

Furthermore, while some embodiments described herein include some but not other features included in other embodiments, combinations of features of different embodiments are meant to be within the scope of the invention, and form different embodiments, as would be understood by those in the art. For example, in the following claims, any of the claimed embodiments can be used in any combination.

In the description provided herein, numerous specific details are set forth. However, it is understood that embodiments of the invention may be practiced without these specific details. In other instances, well-known methods, structures and techniques have not been shown in detail in order not to obscure an understanding of this description.

Where in embodiments of the present invention reference is made to "nuclear magnetic resonance spectroscopy" (NMR spectroscopy), reference is made to methods for determining physical and/or chemical properties of atoms and/or molecules using nuclear magnetic resonance. Intramolecular magnetic fields, which are determined by the molecular configuration, e.g. the electronic structure of a molecule, may affect the resonance frequency, such that, for example, data that relate to the structure, dynamics, reaction state, and/or chemical environment of molecules in a sample may be obtained by NMR spectroscopy.

In a first aspect, the present invention relates to a method for performing nuclear magnetic resonance spectroscopy. This method comprises positioning a sample in a homogeneous stationary magnetic field directed along an axis. The method also comprises preparing nuclei in at least a predetermined volume of the sample for resonant emission of an nuclear magnetic resonance (NMR) signal and creating this NMR signal, in which this preparing and creating comprises irradiating the sample with at least one radio-frequency excitation pulse in accordance with an magnetic resonance imaging (MRI) sequence preparation module and/or an MRI sequence evolution module. The method also comprises, e.g. after this step of creating the NMR signal, sensing the NMR signal in the absence of frequency encoding magnetic field gradients such that analysis of the NMR signal yields a chemical shift spectrum from the nuclei. During this sensing, a plurality of intermittently blipped phase gradient pulses are applied to incrementally shift a position in k-space such that different time segments of the NMR signal demarcated by the blipped phase gradient pulses correspond to different predetermined locations in k-space.

Where in present description reference is made to an MRI sequence, this refers to a plurality of radiofrequency pulses and magnetic gradients that are applied in a predetermined timed and coordinated manner such as to result in a detectable radiofrequency signal or plurality of radiofrequency signals that can be used, by suitable signal processing, to produce at least one image with particular appearance indicative of an internal structure of an object of interest. The MRI sequence may be represented, schematically, in the form of a pulse sequence timing diagram. Such MRI sequence is typically applied in the presence of a strong and substantially homogeneous magnetic field, e.g. a uniform field of at least 0.5 T, preferably at least 1.0 T, e.g. in the range of 1.5 T to 15 T. For example, the MRI sequence may be applied by operating gradient coils and/or radiofrequency antennae, e.g. by operating an MRI apparatus. When current is passed through such coils, in accordance with the MRI sequence, a secondary magnetic field may be created that slightly distorts the main magnetic field in a controlled manner, e.g. such as to shift resonance frequencies of protons in an object under study as a function of position.

Where in present description reference is made to an MRI sequence preparation module, or simply to a preparation module, this refers to a part of an MRI sequence that prepares nuclei for resonant emission, for example by applying gradients to select a predetermined subvolume, e.g. a slice, of the object under study. The preparation module may comprise, for example, at least one 180° inversion pulse, spectral saturation pulses, driven equilibrium pulses and/or spatial saturation pulses. A preparation module may also comprise a timed delay before activating a next module of the MRI sequence, e.g. an evolution module and/or acquisition module. The preparation module may be as simple as applying only a single radiofrequency pulse for spin preparation, yet can also be substantially more complex for particular sequences known in the art.

Where in present description reference is made to an MRI sequence evolution module, or simply to an evolution module, this refers to a part of an MRI sequence that manipulates the emissions of nuclei in the sample under study after a resonant emission of the NMR signal has been created, i.e. initiated by an excitation signal, e.g. in a preparation module of the sequence, e.g. by at least irradiating the sample with at least one radio-frequency excitation pulse in the preparation module. This manipulation may for example comprise applying refocusing radiofrequency pulses to create a train of echo signals. This may, in general, also comprise the application of field gradients, e.g. such as to manipulate the frequency and/or phase properties of the NMR signal(s) after the initial excitation, e.g. to spatially encode the echo signals in such echo train differently.

Where in present description reference is made to the sensing of the NMR signal, this refers to the detection of a radiofrequency signal emitted by the object under study due to a nuclear magnetic resonance excitation, e.g. emitted by protons in the studied object in response to the application of a plurality of magnetic field gradients and/or radiofrequency pulses in accordance with an MRI sequence. This sensing may typically comprise receiving the NMR signal, e.g. using an antenna, and digitizing the received signal, e.g. generating a time series of digital data using an analog to digital converter. This sensing may also comprise other steps as known in the art of NMR signal acquisition, such as applying analog and/or digital filtering, and/or performing other data signal processing steps for, for example, gain control, noise reduction, suppression of other signal sources and/or combining signals acquired simultaneously by different antennae in a suitable manner.

It is an advantage of embodiments of the present invention that short acquisition times can be achieved in NMR spectroscopy, e.g. in magnetic resonance spectroscopic imaging, such as in chemical shift imaging. It is a further advantage of embodiments of the present invention that motion artefacts can be reduced.

Advantageously, a good signal to noise ratio (SNR) can be obtained while collecting the chemical shift information using spatial encoding. This may be achieved by performing a subdivision of an NMR signal, e.g. an MRS signal, acquired from a localized region into a certain number of sub-signals, e.g. the time segments, e.g. sub-echoes, using an inserted blipped phase encoding gradient in one, or several spatial directions. However, since shortening the time-length of the acquired sub-signals, e.g. the time segments of the NMR signal, e.g. sub-echoes, would normally affect both the SNR and the spectral resolution, particularly advantageous embodiments of the present invention may expand the encoded time segments to the full NMR signal length to overcome this problem, e.g. using signal processing to expand the (or each) time segment of the NMR signal in time, e.g. by extrapolation, e.g. using auto-regression methods.

The time duration of the acquisition window of a suitable MRS sequence used in combination with a method in accordance with embodiments of the present invention may determine a maximum number of phase encoding steps that can be inserted, e.g. given a minimum allowed time duration of the time segments. Thus a link can be seen between the spatial and the spectral resolution, and consequently the SNR. Thus, for a single shot acquisition, increasing the spatial resolution would lower the spectral resolution, and vice versa. To ease the stress on the duration of the acquisition window, one can generate multiple NMR signals, e.g. multiple echoes, for the encoding. In such case, the method in accordance with embodiments of the present invention could be comparable to CSI insofar the number of inserted blips would be one per echo, and would reach its full speed when all the necessary blips can be played within a single NMR signal, e.g. a single echo (single shot).

Referring to FIG. 1, an exemplary method 10 for performing nuclear magnetic resonance spectroscopy in accordance with embodiments of the present invention is shown.

The method 10 comprises positioning 11 a sample in a homogeneous stationary magnetic field directed along an axis, e.g. an axis z. The method 10 may also comprise a step of shimming the magnetic field to correct for inhomogeneity of the magnetic field. This may comprise tuning different pulses in three orthogonal principal directions x, y, and z.

The method further comprises preparing 12 nuclei in at least a predetermined volume of the sample for resonant emission of an NMR signal and creating 13 this NMR signal.

This preparing 12 and creating 13 comprises irradiating the sample with at least one radio-frequency excitation pulse in accordance with an MRI sequence preparation module and/or an MRI sequence evolution module.

In a method in accordance with embodiments of the present invention, the step of preparing 12 of the at least one predetermined volume in the sample may comprise irradiating the sample with at least one radio-frequency excitation pulse in accordance with an MRI sequence preparation module to prepare a predetermined imaging slice, e.g. to prepare the at least one predetermined volume in the form of the predetermined imaging slice.

A method in accordance with embodiments of the present invention may be a single-shot method, where only one NMR signal, e.g. a FID or echo, is sufficient to apply all required phase encoding steps, in the form of the intermittently blipped phase encoding gradient, to acquire an entire chemical shift image, e.g. a 2D image, or an entire chemical shift profile, e.g. a 1D 'image'.

However, the method 10 may also comprise repeating 18 at least the step of creating the NMR signal to create at least one further NMR signal and the step of sensing the at least one further NMR signal.

The NMR signal and the or each at least one further NMR signal may correspond to a different predetermined volume in the sample. For example, the repeating 18 may comprise selecting different imaging slices in different repetitions. It is an advantage of embodiments of the present invention that efficient spectroscopic 2D imaging in a slice, or 3D imaging by iterating over a plurality of slices, can be obtained by isolating nuclear spins in a planar slice of the sample.

However, this repeating may also comprise selecting the same volume, e.g. imaging slice, in multiple repetitions, in which a different trajectory in k-space is selected in different repetitions by varying blip amplitudes and/or phase encoding gradients used for generating the intermittently blipped phase gradient pukes, as described further hereinbelow. Furthermore, both different selected slices and different k-space trajectories may be combined in embodiments comprising such repetitions, as shall be clear to the skilled person.

The step of creating 13 of the NMR signal may comprise irradiating the sample with at least one radio-frequency refocusing pulse in accordance with an MRI sequence evolution module so as to invert spins of the nuclei, thereby creating 16 the NMR signal in the form of at least part of an echo signal, e.g. a spin echo signal or a decaying half of an echo signal, e.g. creating the NMR signal in the form of at least part of a spin echo signal.

It is an advantage of embodiments that multiple points in k-space, and hence multiple voxel locations, can be acquired from a single spin echo signal. For example, a larger number of encoding steps can be achieved than the number of echo signals that are generated, e.g. the number of encoding steps may be a multiple of the number of generated echo signals. Furthermore, the number of voxels may be doubled for the same number of data points collected in k-space using the principle of complex conjugate of the Fourier Transform, as discussed further hereinbelow.

For example, the steps of preparing 12 and creating 13 may comprise irradiating the sample with at least three selective radiofrequency pulses while simultaneously applying magnetic field gradients, such as to select the predetermined volume at a predetermined location in the sample in accordance with a point resolved spectroscopy (PRESS) or stimulated echo acquisition mode MRI (STEAM) sequence.

In PRESS, a spin echo signal may be collected to obtain chemical shift information from a box-shaped volume, e.g. a voxel, located at the intersection of three orthogonal planes and selected by using the three RF pulses. The echo signal thus originates from only the box-shaped volume submitted to the three RF pulses. Phase encoding gradients can be activated in between the three RF pulses to enable spatial encoding of the spins during their evolution according to the Fourier Transform principle. For example, in a prior-art PRESS sequence, one needs as many phase encoding gradient steps as the number of voxels that need to be sampled, for each direction to be sampled. The prior-art approach may thus require the same number of echoes for a complete and correct spatial encoding. Therefore, the running time of the prior-art sequence may be equal to the time duration of the base sequence times the number of voxels required in each direction.

However, advantageously, a method in accordance with embodiments of the present invention may reduce the acquisition time of a PRESS sequence, or equivalently of another suitable sequence such as STEAM, by a factor that is at least equal to the number of time segments generated for each NMR signal, e.g. by sub-dividing the acquired echo signal into a number of sub-signals, e.g. sub-echoes, e.g. the time segments of the NMR signal, and inserting the phase encoding gradient in between these sub-signals in the form of a short blip.

The steps of preparing 12 and creating 13 may further comprise applying an MRI sequence module for water signal suppression and/or water signal elimination, such as a CHESS sequence module. For example, because water molecules contain hydrogen and relative concentrations of water to an arbitrary metabolite can be about 10000:1 or even higher in biological samples, the water signal may be advantageously suppressed to allow the metabolite peaks to become discernible in the generated spectra. However, in other embodiments of the present invention, MRS may be achieved without necessarily performing such water suppression.

The method 10 further comprises, e.g. after creating 13 the NMR signal, sensing 14 the NMR signal in the absence of frequency encoding magnetic field gradients such that analysis of the NMR signal yields a chemical shift spectrum from the nuclei. It is known in the art that frequency encoding will adversely affect the chemical shift spectral information in most cases, e.g. unless the MRI sequence is specifically designed to allow the preservation of this spectral information. For example, in a proton echo-planar spectroscopic imaging (PEPSI) sequence as known in the art, a succession of zig-zag readout gradients can be applied to preserve chemical shift information. However, it is an advantage of embodiments of the present invention that a fast and efficient NMR spectroscopy sequence is provided that does not require the application of frequency encoding gradients during sensing that could potentially deteriorate the chemical shift information. It is another advantage that a simple NMR sequence is provided, e.g. that does not require careful optimization of frequency encoding gradients to allow spectroscopic data collection.

During the sensing 14, a plurality of intermittently blipped phase gradient pulses are applied 15 to incrementally shift a position in k-space such that different time segments of the sensed NMR signal correspond to different predetermined locations in k-space. These time segments are demarcated by the blipped phase gradient pulses.

Thus the NMR signal, such as a single MRI echo signal, the decaying part of a single MRI echo signal or a single FID signal, is sub-divided into the time segments. An echo signal may, for example, describe the spin response of the protons of metabolites in a tissue to a radio frequency perturbation. The number of sub-signals, e.g. sub-echoes, e.g. the time segments of an echo signal, may be equal to the number of encoding steps, and thus equal to the number of voxels that are acquired from a single echo signal. Advantageously, this allows performing spatial encoding during the acquisition of a single echo signal, or of half of a single echo signal, e.g. the decaying half of a single echo signal, or likewise, of another NMR signal, such as a single FID signal.

For example, assuming that the applied blips are substantially identical in length, amplitude and encoding gradient direction, a first blip may cause a jump from an initial position in k-space, e.g. from the centre of k-space, in a direction determined by phase encoding gradient used for generating the blip. A second blip may then cause another jump over a same distance as the first jump to arrive at a k-space position twice as far removed from the initial position, e.g. the centre of k space, than the resulting position of the first blip, and so on.

For example, each of the plurality of intermittently blipped gradient pulses may have a pulse width in the range of 1 µs to 10 µs, such as in the range of 2 µs to 6 µs, e.g. 3 µs to 5 µs, e.g. a pulse width of 4 µs. For example, the pulse width, i.e. the duration of each blip, may be preferably as short as can be achieved, or in the shorter end of the range that can be achieved, in view of gradient switching performance of the NMR system used for generating the plurality of blipped gradient pulses.

In embodiments according to the present invention, the plurality of intermittently blipped gradient pulses may have a same pulse width.

The plurality of intermittently blipped gradient pulses may have a same pulse amplitude.

The plurality of intermittently blipped gradient pulses may be applied at regular time intervals, e.g. at a constant time offset with respect to a previous blip. Thus, the plurality of intermittently blipped gradient pulses may be spaced apart in time at regular time intervals.

For example, the time interval between consecutive blips, e.g. being a constant time interval in accordance with some embodiments or a variable time interval in other embodiments, may be preferably smaller than a fourth of the duration of the NMR signal. This time interval is preferably shorter, to allow more encoded segments, and thus more sampled voxels, yet long enough to obtain sufficient time samples points per segment.

For example, blips of the same amplitude, and the same pulse width, i.e. the same length in time, may be activated at regular intervals, to obtain signal segments of equal length and corresponding to a uniform sampling of k-space points (e.g. uniformly sampled along a single direction in k-space corresponding to the phase encoding gradient used for applying the blips). Signal segments of equal length may have the advantage of providing uniformity in the extrapolation result, e.g. to avoid phase shifts in reconstructed spectra. Furthermore, a uniform sampling of k-space points, such as a one-dimensional Cartesian sampling or a two-dimensional Cartesian sampling, may provide data that can be easily processed, e.g. displayed as an image or image volume.

However, the amplitude, pulse width and the time interval between blips may be non-uniform and/or non-constant, e.g. variable, for example such as to achieve a custom, non-uniform sampling in k-space, e.g. a non-cartesian sampling, and/or to collect more data points for some segments as opposed to other segments. For example, a polar sampling can be achieved, in which the steps of a method in accordance with embodiments of the present invention are repeated for different phase encoding gradients, e.g. to sample along different lines through the centre of k-space, e.g. spaced at regular angular intervals. Furthermore, for each sampled line in k-space, the distance in k-space between locations corresponding to consecutively applied blips may be varied, e.g. by selecting appropriate blip amplitudes, such as to, for example, sample more densely near the centre in k-space.

A method in accordance with embodiments of the present invention may also comprise applying 17 a further blipped phase gradient pulse before creating said NMR signal to shift a k-space location corresponding to the first sensed time segment of the plurality of time segments to a peripheral region of k-space, e.g. to an edge of k-space.

It is an advantage of embodiments that multiple points in k-space, and hence multiple voxel locations, can be acquired from a single NMR signal, e.g. created by a single preparation-evolution module of excitation and/or refocusing prior to the signal sensing. For example, the NMR signal may decay over a relatively long time, such that several segments can be collected. For example, the number of different voxel measurements that may be collected may thus be substantially proportional to the decay time.

However, the NMR signal, e.g. a free induction decay (FID) or echo signal, or part thereof, may have a frequency content that changes over time. Therefore, a first time segment may contain substantially all the resonance frequencies generated in the sample (e.g. in a selected volume of the sample), while a second time segment that is acquired later than the first time segment may contain less information due to the decay of signal components that have a short decay time. For example, near the end of the NMR signal, signal components, such as components corresponding to lipids, may disappear. Thus, lipid signal peaks may be reduced in the last segment or segments. However, this can be advantageous in applications where such lipid peaks may be a source of problems, e.g. causing baseline distortion and artefacts in data quantification. Nevertheless, most signal components of interest may have a decay time that is sufficiently long to allow recovery of such signal components from each segment and thus for each sampled k-space location. Furthermore, a deconvolution technique may be applied in the k-space domain to allow signal peak recovery in all sampled k-space locations, including those signals peaks characterized by a rapid decay.

Figure 2:
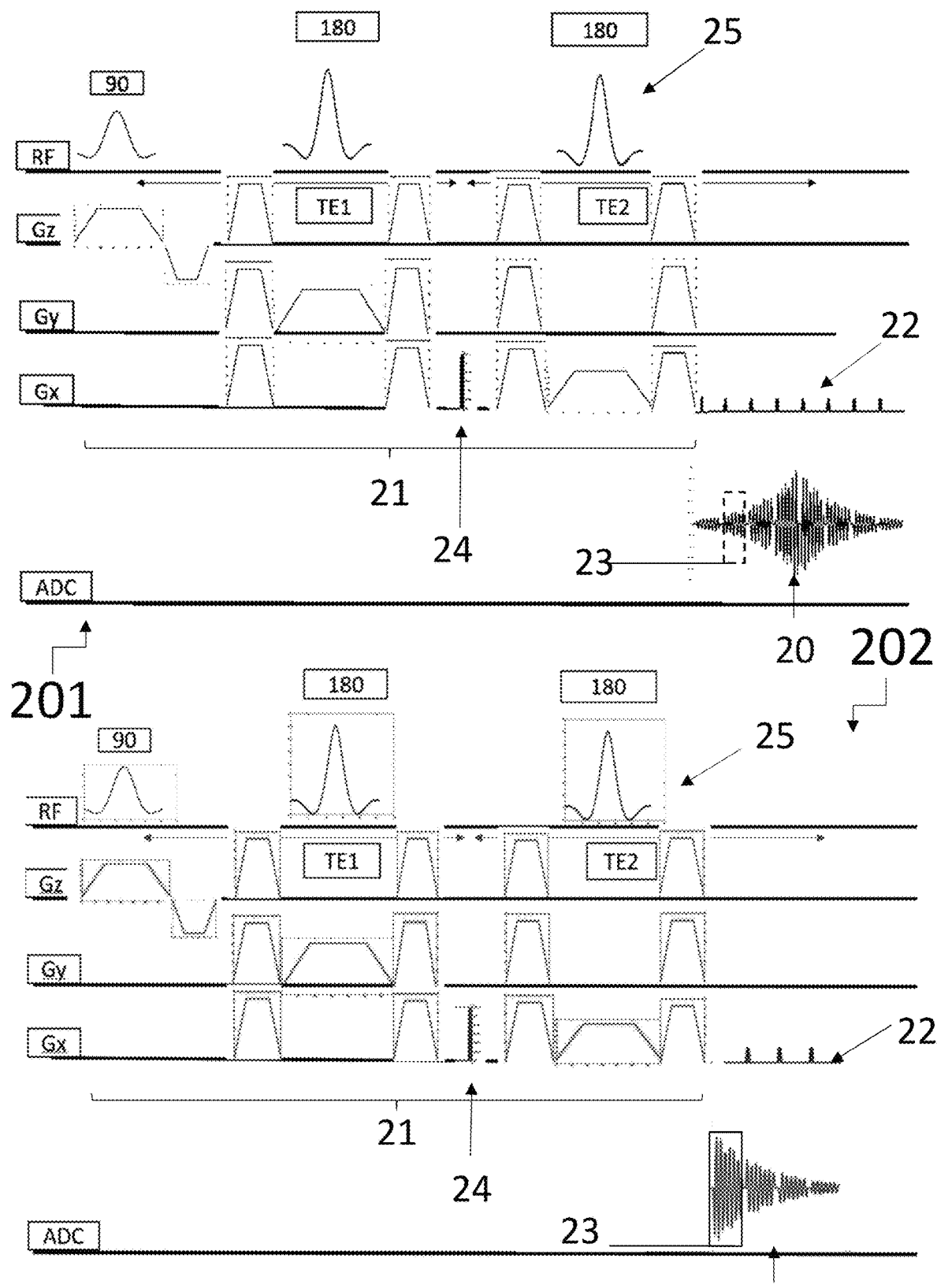
FIG. 2 illustrates an exemplary method in accordance with embodiments of the present invention, based on a PRESS sequence.

FIG. 2 illustrates an exemplary method in accordance with embodiments of the present invention. In a top part 201 of FIG. 2, a simulated NMR signal 20 is shown that corresponds to a spin echo generated from a PRESS sequence 21, while, similarly, in a bottom part 202 of FIG. 2, a simulated NMR signal 20 is shown that corresponds to only the decaying half of a spin echo generated from a PRESS sequence 21. The PRESS sequence allows the generation of such an echo from a voxel volume with variable size and location. The encoding scheme in accordance with embodiments of the present invention may thus be inserted into a PRESS sequence. The PRESS sequence provides an echo from a voxel with variable size and location.

The intermittently blipped phase gradient pulses 22, e.g. the gradient blips, may be generated at equidistant time locations. These blips divide the collected NMR signal 20 into a number of phase encoded (PE) time segments 23, e.g. sub-echoes, with equal time duration. A further blip gradient 24, e.g. which may typically have a larger amplitude than a gradient blip 22, may be played before the second refocusing RF pulse 25 to move the cursor to the edge of the k-space.

Figure 3:
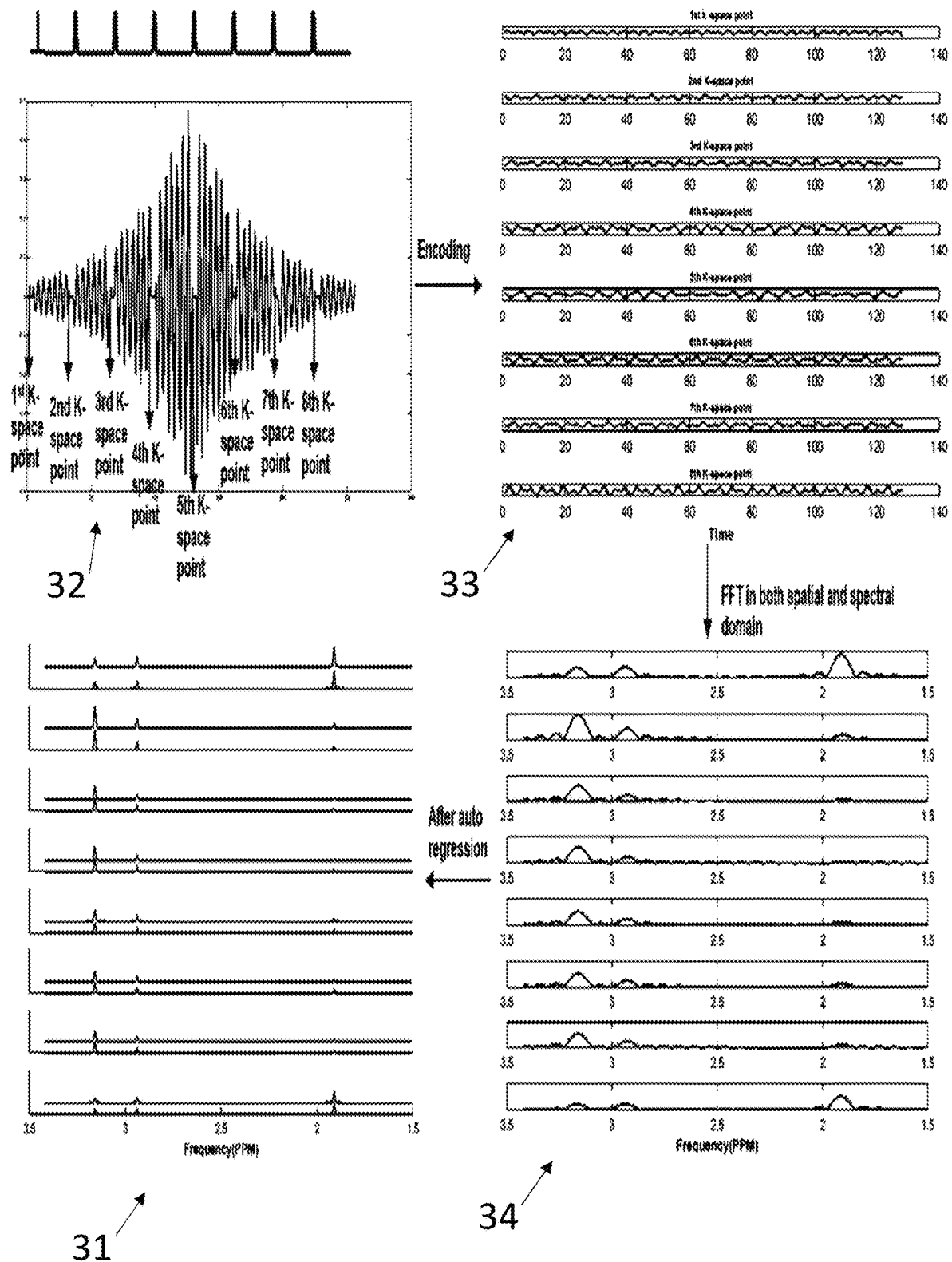
FIG. 3 shows a flow diagram from encoding to reconstruction of data using a fast Fourier transform (FFT) algorithm, in accordance with embodiments of the present invention.

Each time segment is thus phase encoded by the blip gradient and represents one k-space data point, as illustrated in FIG. 3. The collected PE k-space data points may thus fill one line in a given spatial direction, determined by the activation axis of the blipped gradient, e.g. the x axis corresponding to the gradient Gx in present example. FIG. 3 further illustrates a flow diagram from encoding to reconstruction of data using a fast Fourier transform (FFT) algorithm. The results 31 after autoregression show both the reconstructed data and the original data on which the simulation was performed for comparison, in which the original data is shown as the upper plot line of each pair, and the reconstructed data is shown as the lower plot line of each pair. This example relates to the exemplary simulated NMR signal corresponding to a spin echo signal as illustrated in the top part 201 of FIG. 2.

Figure 4:
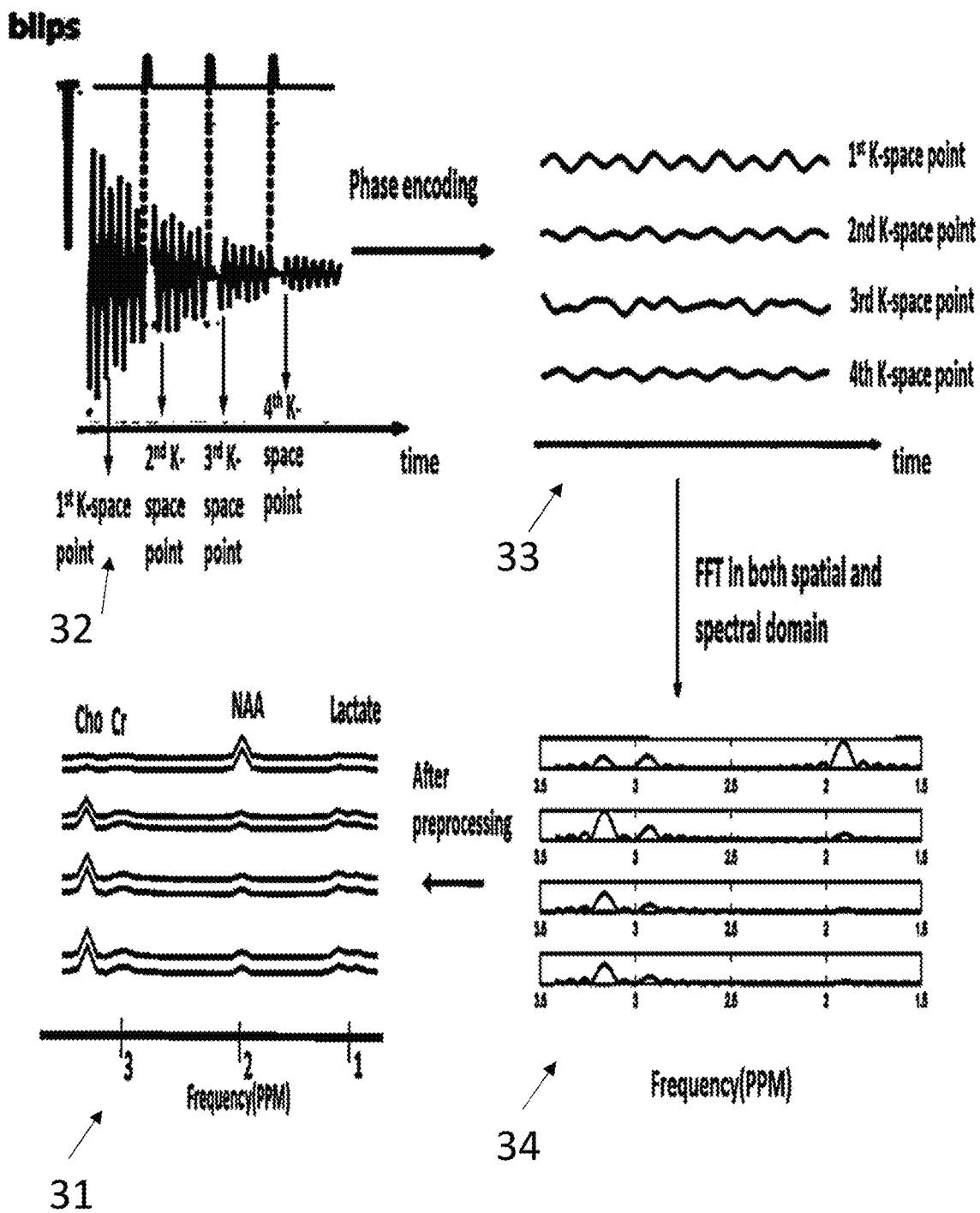
FIG. 4 shows another flow diagram from encoding to reconstruction of data using a fast Fourier transform (FFT) algorithm, in accordance with embodiments of the present invention.

FIG. 4 shows another exemplary flow diagram from encoding to reconstruction of data using a fast Fourier transform (FFT) algorithm, in accordance with embodiments of the present invention. In this example, the results 31 after applying a signal processing as discussed further hereinbelow show both the reconstructed data and the original data on which the simulation was performed for comparison, in which the original data is shown as the upper plot line of each pair, and the reconstructed data is shown as the lower plot line of each pair. This example relates to the exemplary simulated NMR signal corresponding to the decaying half of a spin echo signal as illustrated in the bottom part 202 of FIG. 2.

Figure 5:
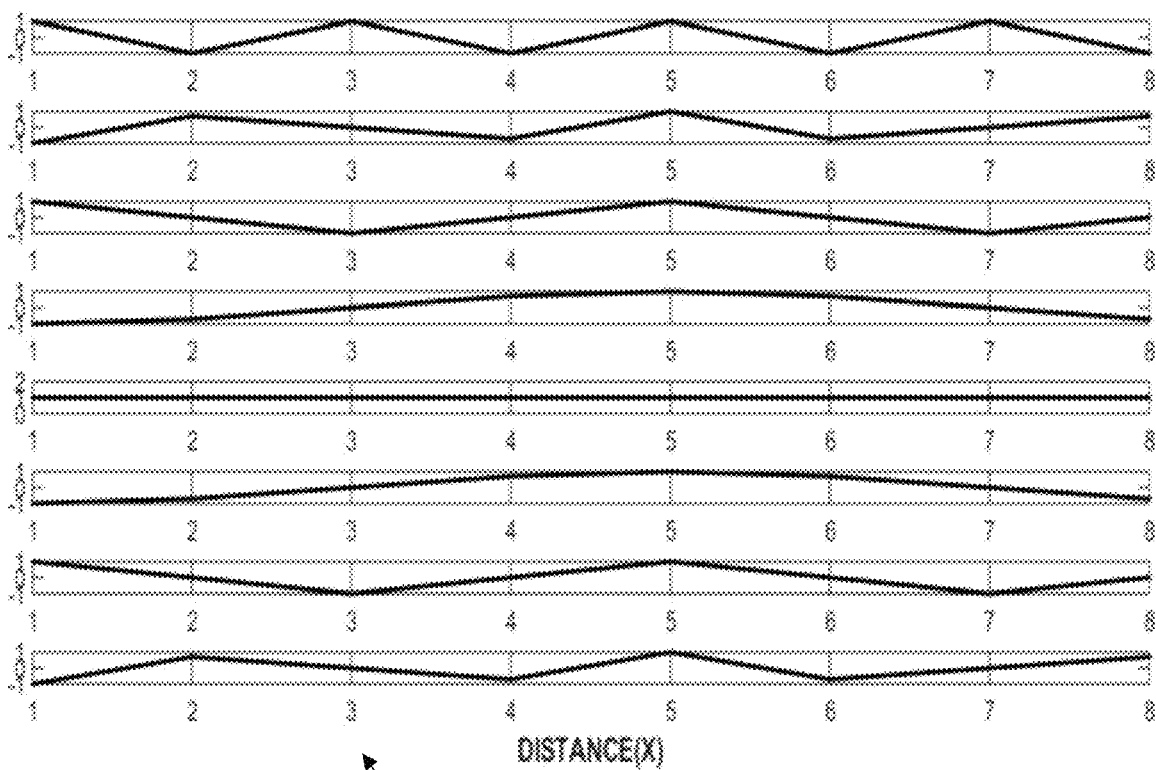
FIG. 5 illustrates an encoding function for encoding time segments, relating to a method in accordance with embodiments of the present invention.
Figure 5:
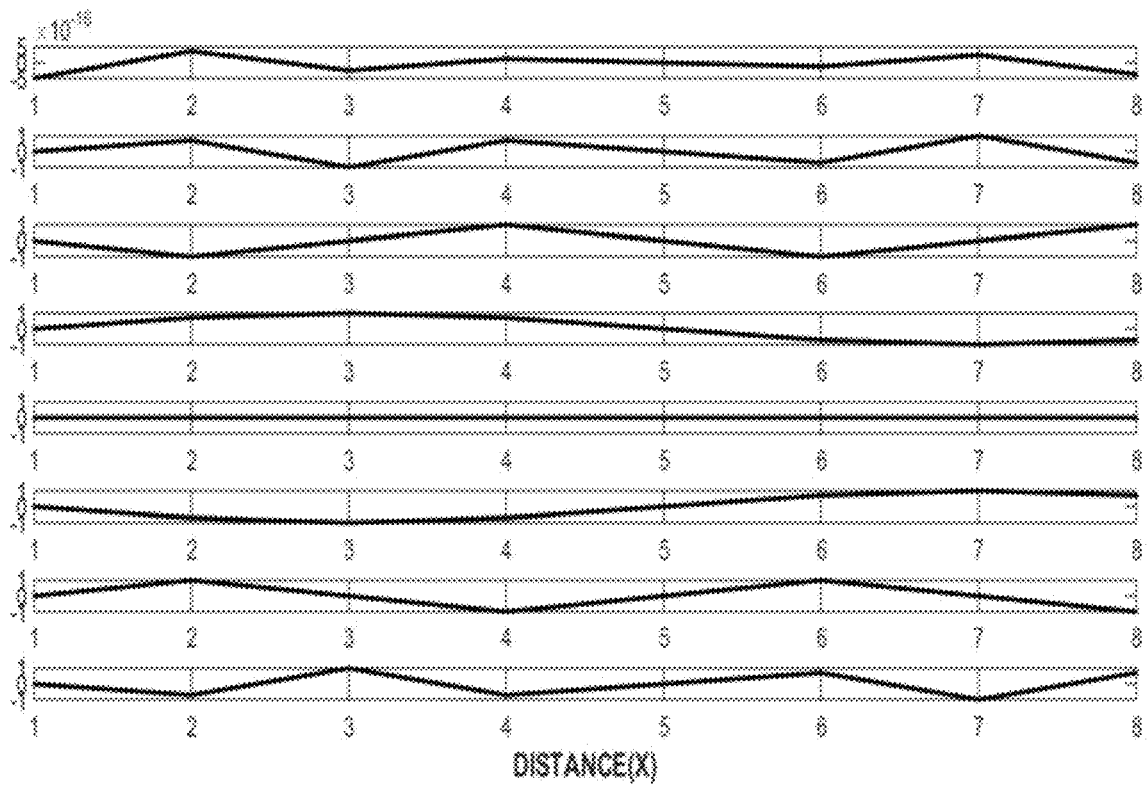

FIG. 5 illustrates the encoding function for encoding the time segments, relating to the first example illustrated in the top part 201 of FIG. 2 and the exemplary flow diagram in FIG. 3, showing both imaginary 402 and real 401 components of the function.

Figure 6:
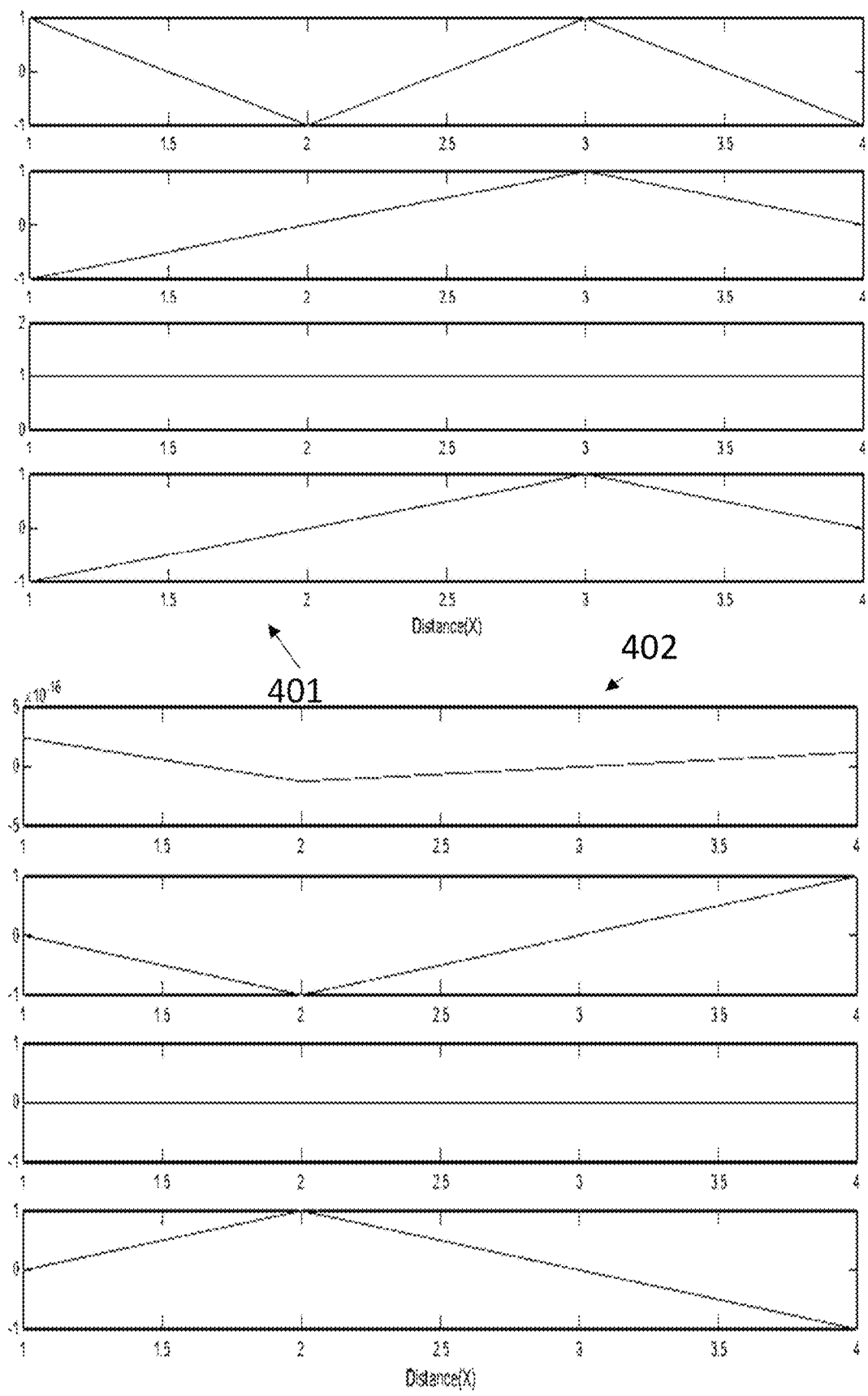
FIG. 6 illustrates another encoding function for encoding time segments, relating to a method in accordance with embodiments of the present invention.

Likewise, FIG. 6 illustrates the encoding function for encoding the time segments, relating to the second example illustrated in the bottom part 202 of FIG. 2 and the exemplary flow diagram in FIG. 4.

The blip gradients may be activated along the x axis and may be played at constant time intervals during the acquisition of the echo signal or, respectively, the decaying half of the echo signal to encode the localized spins based on their spatial locations according to the harmonics shown in respectively FIG. 5 and FIG. 6. The NMR signals of these spatially encoded spins are summed, as shown in plots 32 in respectively FIG. 3 and FIG. 4, and sequentially collected in form of the sub-signals 33, thus filling a k-space x line. A Fourier transform may be applied in both the spatial and spectral domain to produce the localized spectra 34.

Figure 7:
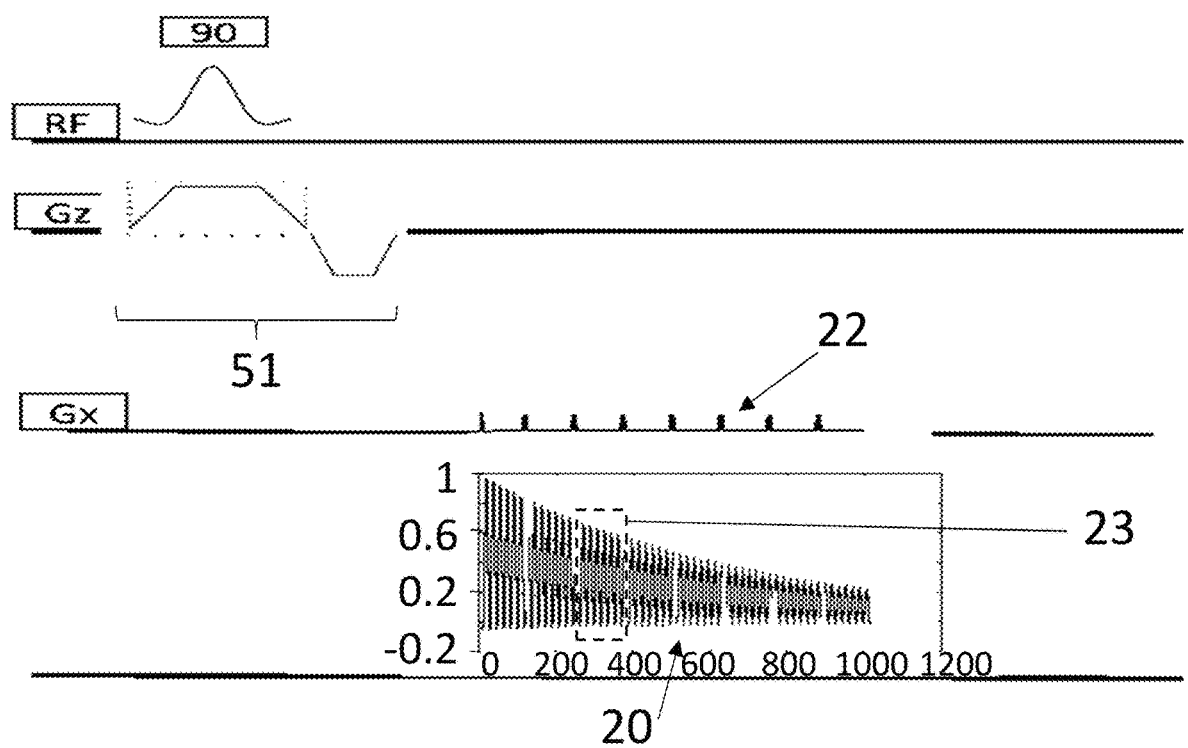
FIG. 7 illustrates an exemplary method in accordance with embodiments of the present invention, based on a FID signal.

In another exemplary method in accordance with embodiments of the present invention, the NMR signal 20 may be generated using a radiofrequency pulse along with a slice selection gradient and a rephasing gradient lobe 51, as a Free Induction Decay (FID) signal from a localized region, which is divided into time segments, e.g. sub-FIDs, in a similar manner as the previous examples using an echo signal or part thereof. A flowchart illustrating the signal generation for this example is shown in FIG. 7.

Figure 8:
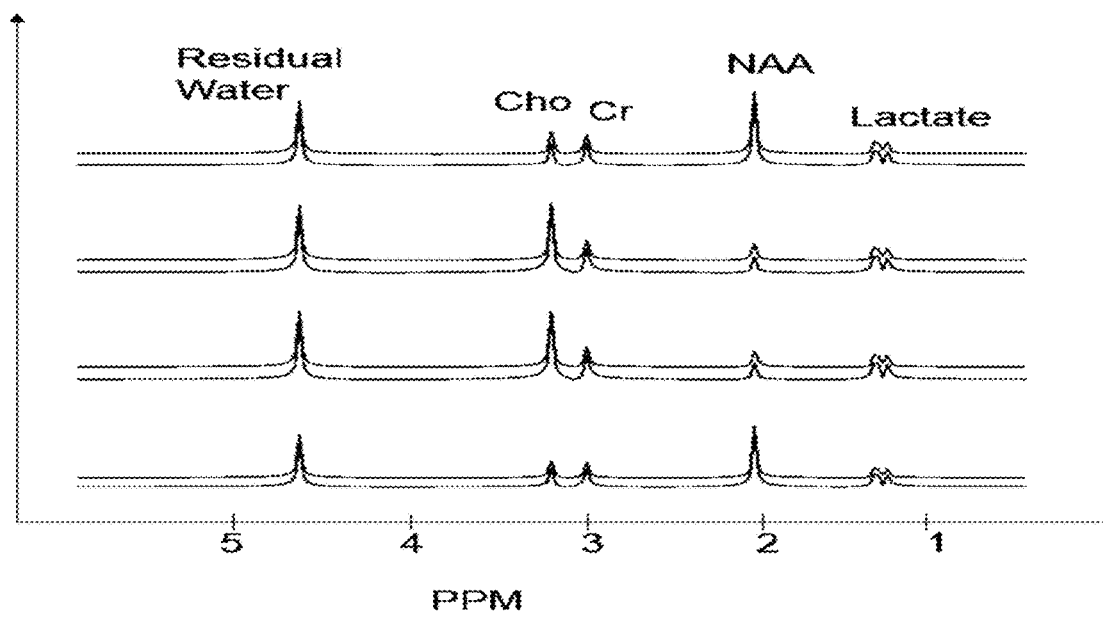
FIG. 8 shows exemplary reconstruction results in an example relating to embodiments of the present invention.

After extrapolating the time segments, e.g. the sub FIDs, in a similar manner as in previous example, a Fourier transform can be performed to reconstruct the original signals. An exemplary result of such reconstruction is shown in FIG. 8. The original reference data is shown as the lower plot line of each pair, and the reconstruction using FFT and auto-regression is shown as the upper plot line of each pair. It can be concluded that in this exemplary simulation the metabolites are localized accurately in both spectral and spatial domain.

Referring back to FIG. 1, a method 10 in accordance with embodiments of the present invention may also comprise, for each of the different time segments of the NMR signal, a signal processing step 19 for processing the time segment of the NMR signal to extend it in time, e.g. to a full time length, e.g. such as to obtain an extrapolated NMR signal representative of the location in k-space corresponding to the time segment that is being extended.

Such processing may be performed to expand the sub-signal, e.g. sub-echo, e.g. in embodiments where the NMR signal is an echo signal or a part of an echo signal, e.g. the decaying part of the echo signal. In such embodiments, each time segment, e.g. each sub-signal, may be expanded to the time-length of a reference signal. For example, an FID signal may be collected with no gradient activation, e.g. without applying blips. This FIB may be used as reference data for the signal processing. Alternatively, another echo or half-echo signal may be used as the reference signal, e.g. an (half-)echo signal without activation of the blip gradients to shift the k-space coordinate, e.g. at a k=0 origin.

For example, this signal processing 19 may comprise extrapolating the time segment of the NMR signal in a forward and/or a backward sense of time such as to obtain an extrapolated NMR signal, representative of the location in k-space corresponding to the time segment that was extrapolated. This extrapolated NMR signal may be extrapolated over at least half of the time interval as the NMR signal was sensed, e.g. over the half of the time covered by the NMR signal, e.g. a half echo, or over the time covered by the NMR signal in its entirety. Thus, each segment of the NMR signal may be extrapolated over at least half of the time frame of the NMR signal.

An extrapolation, such as an auto-regression method, may be used to extrapolate and expand sub-echoes, e.g. in embodiments where the NMR signal is an echo. In such embodiments, each time segment, e.g. each sub-echo, may be expanded to the time-length of a half echo. For example, one half echo may be collected with no gradient activation, e.g. without applying blips. This half echo may be used as reference data for the extrapolation.

For example, the blip gradients may be activated to collect PE/2 encoded sub-echoes during the increasing part of the echo. Thereafter, the blip gradients may be switched off to acquire the decaying half echo to be used as a reference in the extrapolation process. However, it shall be clear to the skilled person that other embodiments may relate to the use the increasing part of the echo as reference and the decreasing part for acquiring the time segments.

The principle of the complex conjugate of the Fourier Transform, referred to further hereinbelow, may then be used on the collected PE/2 encoded sub-echoes to recover the conjugated other PE/2 ones. This is similar to the HASTE MRI method, known in the art, where half of phase encoding k-space data are collected, then complex conjugated to recover the opposite half. In this manner, the acquisition time may be kept short while the sub-echo data are extrapolated to the full time duration of a half echo. As a consequence, problems of peak broadening may be addressed.

A method in accordance with embodiments of the present invention may further comprise a step of computing a complex conjugate of each of the extrapolated NMR signals to obtain a conjugated extrapolated NMR signal representative of a mirror location in k-space. For example, the extrapolation 19 may be performed on each time segment of the NMR signal to extend the segment data to cover the same length as the full NMR signal, and, in a following step, each extrapolated segment may be complex conjugated to generate another half of k-space data. For example, a half-Fourier approach may be applied, taking the relation $S(-k)=S^*(k)$ into account, in which S refers to the extrapolated NMR signal, $S^*$ to its complex conjugate and k to k-space coordinates.

In a step of signal processing 19 in a method in accordance with embodiments of the present invention, the time segment of the NMR signal may be expanded, e.g. extended, e.g. extrapolated. As described hereinabove, this extrapolation may comprise, for example, an auto-regression or similar regression algorithm. Alternatively, the signal processing may comprise a model-based time-expansion method as described hereinbelow and illustrated by the exemplary flow diagram in FIG. 9.

Each time segment of the NMR signal, e.g. each acquired sub-signal, can be described by a combination of two sets of functions, in which the first functions are representative of the amplitude of a predetermined, e.g. selected, plurality of spectral peaks, for example related to a predetermined plurality of metabolites, while the second functions are a time-shifted functions representative of other spectral parameters than the amplitude of the predetermined spectral peaks, e.g. representative of the remaining chemical shift parameters, such as frequency and damping factor, of the predetermined spectral peaks.

The spectral peaks in the first functions may be phase modulated due to the activation of the blipped gradients (e.g. thus being dependent on the k-space coordinate). This first function therefore can differ from one sub-signal to another.

The second functions may be substantially identical across the acquired sub-signals. Therefore, the constant parameters of the spectral peaks, e.g. frequency and damping factor, can be estimated by fitting a full time length reference signal acquired at the center of k-space (k=0) to an appropriate signal model representing the selected spectral peaks.

For example, a time segment, representative of a sample of k-space data along a direction x in which the blipped phase encoding gradients are applied, may be expressed by:

$$s(k,t_j) = \int \bar{s}(x,t_j) \cdot e^{(i \cdot 2 \cdot \pi \cdot k \cdot x)} \cdot dx$$

with $$\bar{s}(x,t_j) = \sum_{m=1}^{M} A_{m_x} \cdot e^{-t_j(d_m+2\pi i f_m)} + \varepsilon(t_j),$$

in which $t_j$ is the constant time duration of the $j^{th}$ acquired sub-signal, proportional to the number of data points of the sub-signal $N_{sub}$ ($N_{sub}=N_{full}/R$), which may run from $1+(j-1) \cdot N_{sub}$ to $j \cdot N_{sub}$. Furthermore, $N_{full}$ refers to the total number of points of the acquired NMR signal, and R may be referred to as an acceleration factor, in which R is equal to the number of the sub-signals into which the NMR signal is partitioned. The variable j sets the time occurrence of each sub-signal, i.e. indexes the time segments in chronological order, and assumes integer values from 1 to R. M is the number of predetermined peaks, e.g. indicative of predetermined signal metabolites, with A, d and f describing amplitude, damping factor and frequency for each peak m, e.g. for each metabolite, and $\varepsilon(t)$ denotes a noise term. By combining the two equations hereinabove, the encoded sub-signal s, for a data point $k_j$ in k-space, can be written as:

$$s(k_j, t_j) = \int \sum_{m=1}^{M} A_{m_x} \cdot e^{-t_j(d_m+2\pi i f_m)} \cdot e^{(i \cdot 2 \cdot \pi k_j \cdot x)} \cdot dx + \varepsilon(t_j)$$

$$\sum_{m=1}^{M} A_{m_x}^{\phi k_j} \cdot \psi_{sub}(m, t_j) + \varepsilon(t_j)$$

where $$A_{m_{k_j}}^{\phi_{k_j}} = \int A m_x \cdot e^{1 \cdot 2\pi k_j x} dx$$

are the first functions specific to each sub-signal due to their dependence on the k-space variable $$k_j(k_j) = \left(\frac{\gamma}{2 \cdot \pi}\right) \int_0^{\tau_G} G_x(t) \cdot dt,$$

with $\tau_G$ representative of the gradient blip duration) and the second functions $\psi_{sub}(m,t_j)=e^{-t_j(d_m+2\pi i f_m)}$ are dependent on the parameters $d_m$ and $f_m$ of the spectral components during the time $t_j$. and independent of the k-space coordinate.

The constant parameters of the predetermined spectral peaks, e.g. frequency and damping factor, can be estimated by fitting a full time length reference signal acquired at the center of k-space (k=0) to the signal model representing the predetermined spectral peaks.

Therefore, the step of signal processing may further comprise estimating parameters of said spectral peaks that are substantially constant over the time segments, e.g. the other spectral parameters than amplitude, e.g. parameters such as frequency and damping factor, by fitting a reference signal, e.g. being defined over a longer time interval than each of the time segments cover, e.g. being defined over a full time scale of the NMR signal to a signal model representative of the predetermined spectral peaks. The reference signal, e.g. a FID signal, may be acquired 91, e.g. a pre-acquired reference signal may be stored and used in the step of signal processing 19, at the center of k-space (e.g. where k=0).

For example, To estimate $d_m$ and $f_m$, a full time length reference signal may be acquired at $k_j=0$ and fitted to the corresponding full time length signal model given by:

$$s(k_j = 0, N_{full}) = \sum_{m=1}^{M} A_{m_{k_j}=0}^{\phi_{k_j}=0} \psi(m, N_{full})$$

where $t_j$ is replaced by the time length $N_{full}$ for expanding the time segments to, and $\phi k_j$ is set to 0. The normalized basis $\psi_{full}(m,N_{full})$ over the time length $N_{full}$ may be described by an $N_{full} \times M$ matrix:

$$\psi_{full}(m, N_{full}) = \begin{pmatrix} e^{-t_1(d_1+2\pi i f_1)} & \cdots & e^{-t_1(d_M+2\pi i f_M)} \\ \vdots & \ddots & \vdots \\ e^{-t_{N_{full}}(d_1+2\pi i f_1)} & \cdots & e^{-t_{N_{full}}(d_M+2\pi i f_M)} \end{pmatrix}$$

and for each $t_j$, a corresponding sub-basis function $\psi_{sub}(m,t_j)$ reduced to $N_{sub} \times M$ may be extracted:

$$\psi_{sub}(m, t_j) = \begin{pmatrix} e^{-t(1+(j-1)*N_{sub})(d_1+2\pi i f_1)} & \cdots & e^{-t(1+(j-1)*N_{sub})(d_M+2\pi i f_M)} \\ \vdots & \ddots & \vdots \\ e^{-t(j*N_{sub})(d_1+2\pi i f_1)} & \cdots & e^{-t(j*N_{sub})(d_M+2\pi i f_M)} \end{pmatrix}$$

Therefore, an encoded sub-signal $s(k_j,t_j)$ can be modeled by a noiseless matrix form as:

$$s(k_j, t_j) = \psi_{sub}(m, t_j) \cdot \begin{pmatrix} A_{1_{k_j}}^{\phi_{k_j}} \\ \vdots \\ \vdots \\ A_{M_{k_j}}^{\phi_{k_j}} \end{pmatrix}$$

Or, by substitution by the equation for $\psi_{sub}(m,t_j)$ provided hereinabove, $s(k_j,t_j)$ can be expressed as:

$$\begin{pmatrix} s_{(1+((j-1)*N_{sub}))} \\ \vdots \\ s_{(j*N_{sub})} \end{pmatrix} =$$

$$\begin{pmatrix} e^{-t(1+(j-1)*N_{sub})(d_1+2\pi i f_1)} & \cdots & e^{-t(1+(j-1)*N_{sub})(d_M+2\pi i f_M)} \\ \vdots & \ddots & \vdots \\ e^{-t(j*N_{sub})(d_1+2\pi i f_1)} & \cdots & e^{-t(j*N_{sub})(d_M+2\pi i f_M)} \end{pmatrix} \cdot \begin{pmatrix} A_{1_{k_j}}^{\phi_{k_j}} \\ \vdots \\ \vdots \\ A_{M_{k_j}}^{\phi_{k_j}} \end{pmatrix}$$

where the complex amplitudes $$\begin{pmatrix} A_{1_{k_j}}^{\phi_{k_j}} \\ \vdots \\ \vdots \\ A_{M_{k_j}}^{\phi_{k_j}} \end{pmatrix}$$

can be estimated using a matrix inversion or approximate matrix inversion algorithm, e.g. a pseudo-inverse matrix operation, and then injected into the equation $$s(k_j, N_{full}) = \sum_{m=1}^{M} A_{m_{k_j}}^{\phi_{k_j}} \psi(m, N_{full})$$

to construct full time noiseless encoded MRS signals. A Fourier Transform can be applied on both spatial and spectral domain to obtain the spatial distribution of the metabolite peaks.

The processing method can be comparable to CSI when the number of inserted blips is one per acquired signal (R=1), and reaches a high speed gain when all the necessary blips are played within a single acquisition (R=PE), with PE equal to the total number of phase encoding steps. Therefore, the acquisition time reduction is proportional to R.

The efficiency of a method in accordance with embodiments of the present invention may be linked to the accuracy of the estimation of the sub-signal parameters. If frequency and damping factors may be assumed to be generally accurately estimated from the reference signal, as described hereinabove, the estimation of the phase modulated amplitudes values, from which precise metabolite maps may be derived, might still be challenging due to the decreasing SNR of the sequentially acquired sub-signals. The SNR per voxel of a 1D CSI is given by:

$$SNR_{CSI} = \frac{A \cdot e^{-\tau_G/T_2^*} \cdot T_2^* \cdot \Delta f \cdot (1 - e^{-N_{full}/T_2^*})}{a \cdot \sqrt{N_x} \cdot \sqrt{N_{full}\Delta f}}$$

where A denotes the peak amplitude of a metabolite. $N_x$ is the number of voxels along x direction, $\Delta f$ is the bandwidth of the MRS spectrum, and a being a constant term contributing to the noise standard deviation. The term $(1-e^{-N_{full}/T_2^*})$ is related to the duration of the acquisition window. Given the acceleration is performed along x direction, one can derive the SNR per voxel of this exemplary method in accordance with embodiments of the present invention:

$$SNR_{RAPID} = \frac{A \cdot e^{-\tau_G/T_2^*} \cdot (1 + e^{-N_{full}/R \cdot T_2^*} + e^{-2 \cdot N_{full}/R \cdot T_2^*} + \ldots + e^{-(R-1)N_{full}/R \cdot T_2^*}) \cdot T_2^* \cdot \Delta f \cdot (1 - e^{-N_{full}/R \cdot T_2^*})}{a \cdot R \cdot \sqrt{N_x} \cdot \sqrt{N_{sub}\Delta f}}$$

Which can be rewritten as:

$$SNR_{RAPID} = \frac{A e^{-\tau_G/T_2^*} \cdot T_2^* \Delta f \cdot (1 - e^{-N_{full}/T_2^*})}{a \cdot R \cdot \sqrt{N_x} \cdot \sqrt{N_{full}\Delta f / R}}$$

Therefore:

$$SNR_{RAPID} = \frac{SNR_{CSI}}{\sqrt{R}}$$

The sensitivity for RAPID is known to approach $\Psi_{RAPID} = \Psi_{CSI}$. The SNR can be increased by shortening $N_{full}$, which could be set to the shortest $T_2^*$ value of the collected metabolite signals (e.g: $N_{full} \cong T^*_{2,shortest}$). However, reducing the number of points $N_{full}$, lowers the acceleration factor R since a minimum data length of $N_{sub}$ is required to allow for an accurate estimation of the phase modulated amplitudes $$A_{m_{k_j}}^{\phi_{k_j}}.$$

Therefore, to allow for higher acceleration and minimise the SNR loss, $N_{full}$ may generally be set equal to the longest $T^*_2$ value of the collected metabolite signals ($N_{full} \cong T^*_{2,longest}$).

In a processing method in accordance with embodiments of the present invention, a reference signal and the sub-signals may be used to estimate the parameters and to produce noiseless reconstructed encoded full time signals, which can be used to create metabolite maps. As a consequence, both SNR and spectral resolution may be increased.

For an accurate estimation of the signal parameters, both $N_{full}$, and R are preferably selected appropriately, as described hereinabove. A robust post-processing technique, e.g. a HLSVD-PRO method, may preferably be applied to achieve both data denoising and signal parameter estimation.

The step of signal processing may further comprise using the estimated parameters to generate a noiseless basis representing the predetermined spectral peaks over a longer time interval than each of the time segments cover individually, e.g. over the full time scale of the NMR signal, e.g. in which the amplitudes of the predetermined spectral peaks are normalized.

The step of signal processing may further comprise partitioning the basis into time segments of the basis corresponding to the time segments of the NMR signal.

The step of signal processing may further comprise fitting each time segment of the NMR signal to a linear combination of the time segments of the basis to determine complex valued coefficients representative of phase modulated amplitudes of the predetermined spectral peaks for each time segment.

For example, the normalized basis may be time-partitioned into sub-bases similar to the encoded sub-signals, which may be represented in a matrix form, and may be fitted to the corresponding collected sub-signals. Thus, the corresponding phase modulated amplitudes of the peaks can be estimated.

The step of signal processing may further comprise extending each time segment in time, e.g. extrapolating each time segment in time, e.g. in a forward and/or backward sense of time, by using the linear combination of the basis corresponding to the complex valued coefficients for the time segment as the extended and/or extrapolated time segment.

For example, once the complex amplitudes of the peaks are estimated for each time segment, they can be inserted into the full basis, e.g. the normalized basis without time-partitioning applied thereto, to generate a full time-length encoded MRS signal for each time segment.

Alternatively, the step of extrapolating 19 may comprise applying an autoregressive model or a generalized autoregressive model to extrapolate the time segment of the NMR segment in the forward sense of time and/or in the backward sense of time.

In a method in accordance with embodiments, the NMR signal may be an echo signal, and the step of extrapolating 19 may comprise applying a first autoregressive model to extrapolate the time segment in a time sense away from a time of occurrence of the maximum of the echo signal envelope, thus producing a first extrapolated signal, and applying a second autoregressive model to extrapolate the first extrapolated signal in a time sense toward the time of occurrence of the maximum of the echo signal, thus producing the extrapolated NMR signal. The same auto regressive model to extend a time segment in a backward sense towards the maximum of the echo and in a forward sense towards the end of the echo may be used.

The order of the autoregressive model may, for example, be selected as the order that minimizes an error variance, an Akaike information criterion, a Bayesian information criterion, another information-theoretic information criterion or a similar figure-of-merit criterion. For example, the model order may be selected by fitting a plurality of autoregressive models of different order to a reference signal. The model order which results in lowest error variance, e.g. as used to determine an Akaike information criteria, may be selected as the model order. The model may thus generate autoregressive coefficients, for the selected model order, that may be used to extrapolate the time segments.

For example, Burg's method may be applied to determine filter coefficients in an auto-regression model. This method has been applied in signal processing, as described by Uchiyama et al., in "In Vivo potassium-39 NMR spectra by the burg maximum-entropy method," Journal of Magnetic Resonance (1969), 1991. 94(3): p. 449-454.

An auto-regression model can be formulated as:

$$x(n) = -a_1 x(n-1) - a_2 x(n-2) - \ldots - a_M x(n-M) + v(n), \ldots n=1,2,\ldots,N,\ldots$$

where x(n) is a reference signal, for example one half of an echo signal, M is the order of the prediction filter polynomial $a=[a_1, a_2, a_3, \ldots, a_M]$, and v(n) is white Gaussian noise. The filter coefficients can be calculated using Yule Walker equations:

$$\begin{bmatrix} r(0) & r(-1) & \ldots & \ldots & r(-M+1) \\ r(1) & r(0) & \ldots & \ldots & r(-M+2) \\ & & & \vdots & \\ r(N-1) & r(N-2) & \ldots & \ldots & r(0) \end{bmatrix} \times \begin{bmatrix} a_1 \\ a_2 \\ a_3 \\ \vdots \\ a_M \end{bmatrix} = \begin{bmatrix} r(1) \\ r(2) \\ r(3) \\ \vdots \\ r(M) \end{bmatrix}$$

where $r=[r(0), r(1), r(2), \ldots, r(M)]$, are the autocorrelation estimate of x(n).

Figure 10:
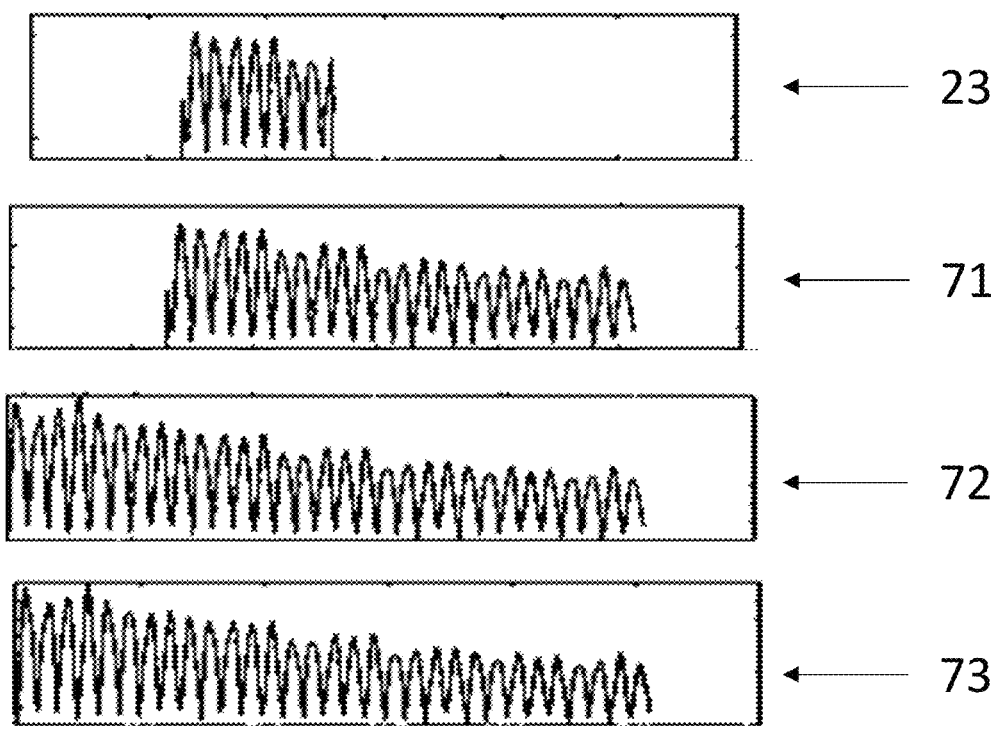
FIG. 10 shows a forward and backward extrapolation in a method in accordance with embodiments of the present invention.

These equations may, for example, be solved using the Levinson-Durbin recursion method, e.g. as implemented in MATLAB. The Akaike Information Criterion (AIC) may be used to determine the model order. The model order is used in the AR model described hereinabove and the filter coefficients may be calculated using the Burg's method for better accuracy in the determination of the coefficients. The model along with the filter coefficients can thus be used to extrapolate the acquired time segments of the NMR signal in both forward and backward directions as demonstrated in FIG. 10. A time segment 23 may be first extrapolated 71 in a forward direction and then extrapolated 72 in a backward direction. For comparison, the reference signal 73, e.g. a half echo, is shown.

However, embodiments of the present invention are not necessarily limited to extrapolation using auto-regressive methods. For example, other methods, which are known in the art for the purpose of extrapolation, may be applied, such as singular value decomposition (SVD) based methods for solving the filter coefficients as described in Barkhuijsen et al., "Retrieval of frequencies, amplitudes, damping factors, and phases from time-domain signals using a linear least-squares procedure," Journal of Magnetic Resonance (1969), 1985. 61(3): p. 465-481 and in Lin et al., "A Novel Detection-Estimation Scheme for Noisy NMR Signals: Applications to Delayed Acquisition Data," Journal of Magnetic Resonance, 1997. 128(1): p. 30-41.

Furthermore, ARMA based modelling may also be applied, e.g. as has been used for spectroscopy signals as mentioned in Tomczak et al., "A subband ARMA modeling approach to high-resolution NMR spectroscopy," Journal of Magnetic Resonance, 2002. 158(1-2): p. 86-98.

A method in accordance with embodiments of the present invention may further comprise applying a Fourier transform to the time segments, or to the extrapolated NMR signals, in both the k-space dimensions and the time domain dimension, such as to provide chemical species spectra as function of spatial location in the sample.

A method in accordance with embodiments of the present invention may further comprise obtaining an image of the sample representative of spatial variations in a chemical constitution of the sample and storing the image in a data storage memory. For example, the chemical species spectra as function of spatial location may determine, or may be used to determine, such image.

In a second aspect, the present invention also relates to a control unit that comprises a controller configured for controlling a magnetic resonance scanner such as to perform the steps of a method 10 in accordance with embodiments of the present invention.

In a third aspect, the present invention also relates to a magnetic resonance scanner system that comprises such control unit in accordance with embodiments of the present invention.

Hereinbelow, theoretical considerations are described relating to embodiments of the present invention. These theoretical considerations are provided to aid the skilled person in understanding the invention and reducing the invention to practice, and should not be construed as limiting the invention in any way.

Methods in accordance with embodiments of the present invention may be based on a sub-division of an NMR signal, e.g. a MRS echo signal, that may be collected from a defined excited region using any suitable MRS sequence, e.g. a PRESS or STEAM sequence. This signal is divided into a predetermined number of time segments, e.g. sub-signals, such as sub-echoes, by inserting blipped phase encoding gradients, e.g. applied by a gradient corresponding to a predetermined spatial direction, for example in a direction x. The inserted blipped gradients may be applied at a constant time interval, and may have a constant amplitude, such that the phase encoding principle is satisfied, thereby linearly spanning the k-space:

$$k_x(t) = \frac{\gamma}{2\pi} \int_0^{T_G} G_x(t) \cdot dt$$

where $G_x$, is the blipped gradient amplitude applied along the x axis during the gradient duration time $T_G$. Therefore, each acquired sub-signal may be a simultaneous collection of one k-space data point and the chemical shift information, e.g. a collection of spatial and spectral information at the same time, which is described by:

$$s(k_x, t_j) = \int \bar{s}(x, t_j) \cdot e^{(i \cdot 2 \cdot \pi \cdot k_x \cdot x)} \cdot dx$$

where $t_j$ set to $[\Delta(j-1), \Delta j]$ determines the time occurrence of the sub-acquisition window $\Delta$ ($\Delta = T/PE$) for the $j^{th}$ sub-signal, with PE the number of phase encodings (and hence the number of voxels) and T the time duration of the whole acquisition window. The variable j runs from 1 to (PE-1) (1 to PE). This equation can be approximated as a discrete sum:

$$s(k_x, t_j) = \sum_{n=0}^{PE-1} \bar{s}(n \cdot \Delta x, t_j) \cdot e^{(i \cdot 2 \cdot \pi \cdot k_x \cdot (n \cdot \Delta x))} \cdot dx$$

The sub-signal $\bar{s}$ may be described by:

$$\bar{s}(x, t_j) = \sum_{m=1}^{M} A_{m,x} \cdot e^{-(d_{m,x} \cdot t_j + 2\pi i f_{m,x} t_{m,x})}$$

where M is the number of metabolites, with A, d, and f describing amplitude, damping factor and frequency for each metabolite m.

The k-space line can thus be filled by collecting PE equidistant data points $s(k_x, t_j)$. This is achieved by linearly moving the $k_x$ variable in the encoded direction by increasing the accumulated blipped gradient amplitude, whereas the chemical shift information can be stored during the acquisition of the sub-signals. A Fourier Transform may then be performed on both the spatial and spectral domain to obtain the spatial distribution of the metabolite peaks.

Spatial and spectral resolution may be limited due to a small number of data points that can be collected in both spatial and spectral domain. The spatial resolution may be set by the number of phase encodings PE, whereas the spectral resolution may be given by the sub-signal time-length set to N/PE, with N the total number of points of the collected MRS signal. In order to increase the spectral resolution, an auto-regressive approach may be used, in accordance with embodiments of the present invention, e.g. in a forward and/or a backward time sense, on each collected sub-signal to extrapolate it, e.g. to the total number N. As a consequence, a good SNR and spectral resolution can be achieved. As for the spatial direction a simple zero filling and a filtering procedure may be applied to reduce pixel contamination.

However, k-space coverage is not necessarily restricted to a linear span. Other trajectories in k-space may be applied, e.g. by varying the blip amplitudes, the blip durations, varying the time interval in between blips, and/or varying the gradient direction in which the blips are applied. For example, in order to preserve the SNR, more data points may be collected around the centre of k-space and less points near the edges of k-space.

To show the performance of a method in accordance with embodiments of the present invention, corresponding to the PRESS-based sequence illustrated in FIG. 3, a number of PE voxels containing each a noiseless proton brain spectrum containing the three main metabolites, namely, Creatine, Choline and NAA, were simulated in the example provided hereinbelow.

The amplitude of the peaks of interests are varied in each voxel to duplicate real case spectra of healthy and brain tumor tissues. In a second set, noise with random distribution as well as macromolecules peaks describing baseline distortion are added into these spectra. The method was simulated in a Matlab code and tested against the reference spectra referred to hereinabove to recover the correct spatial distribution along with the estimation of the metabolite peaks.

In this example, the echo time length N was fixed, e.g. to 512 points, then the number of voxels PE was varied, respectively for values 1, 4, 8 and 16, thus setting the time-length of each sub echo to N/PE. At each PE value the encoded sub-echoes were extrapolated to N/2 using a linear regression method and zero filled to the full length N Fourier transform is then used in both space and frequency domain to recover the spatial distribution of the spectra. The metabolite peaks of the spectra are fitted to a Lorentzian model to estimate their amplitudes.

Figure 11:
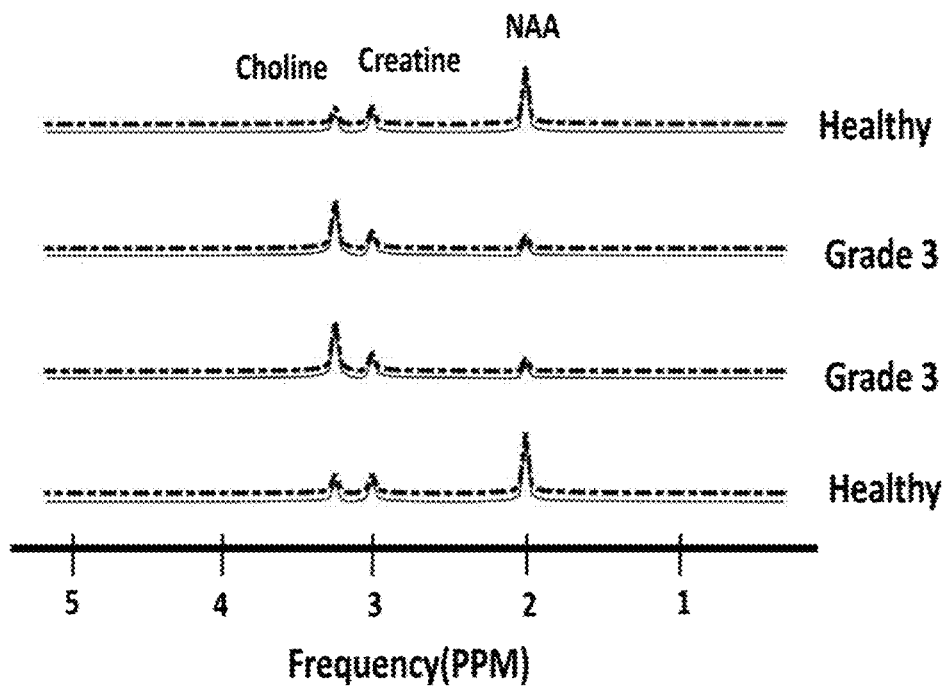
FIG. 11 shows simulated results using spectra without added noise, in an example illustrating embodiments of the present invention.
Figure 12:
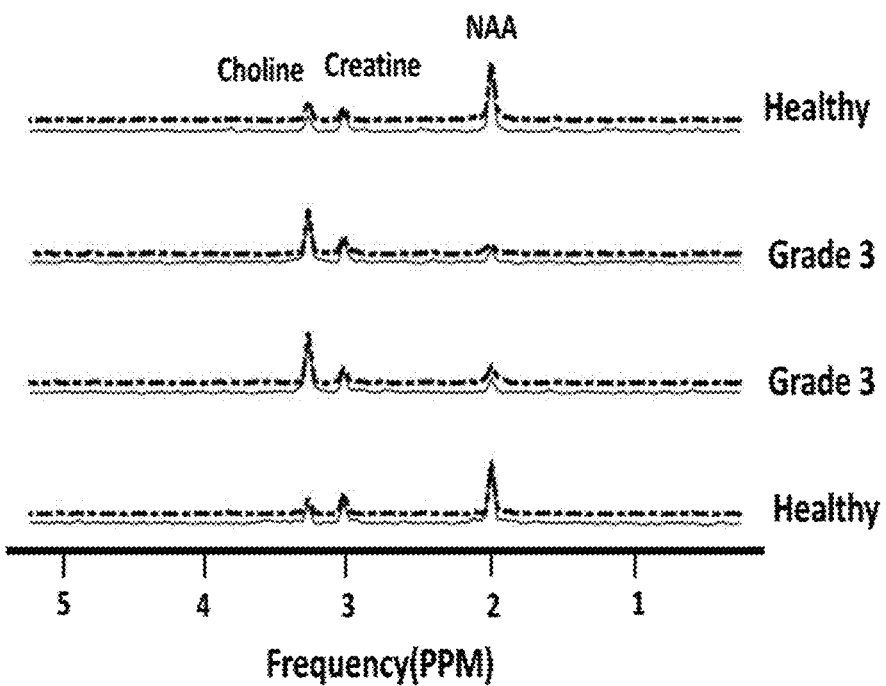
FIG. 12 shows simulated results using spectra with added noise, in an example illustrating embodiments of the present invention.

FIG. 11 and FIG. 12 show four recovered spectra without and with noise, corresponding to PE=4. FIG. 11 shows the noiseless original simulated spectra, e.g. the gold standard spectra, as the solid line of each pair, and the corresponding reconstructed spectra as the dashed line of each pair. FIG. 12 shows noisy original simulated spectra, with a SNR=20 dB, as the solid line of each pair, and the corresponding reconstructed spectra as the dashed line of each pair.

As can be observed, the method in accordance with embodiments can accurately recover the correct spatial position of each spectrum, regardless of whether it belongs to a healthy or tumoral simulated tissue. The amplitudes of the peaks namely, creatine, choline and NAA are calculated using a spectral fitting method and compared to the expected ones. The results are shown in FIG. 13 to FIG. 20.

Figure 13:
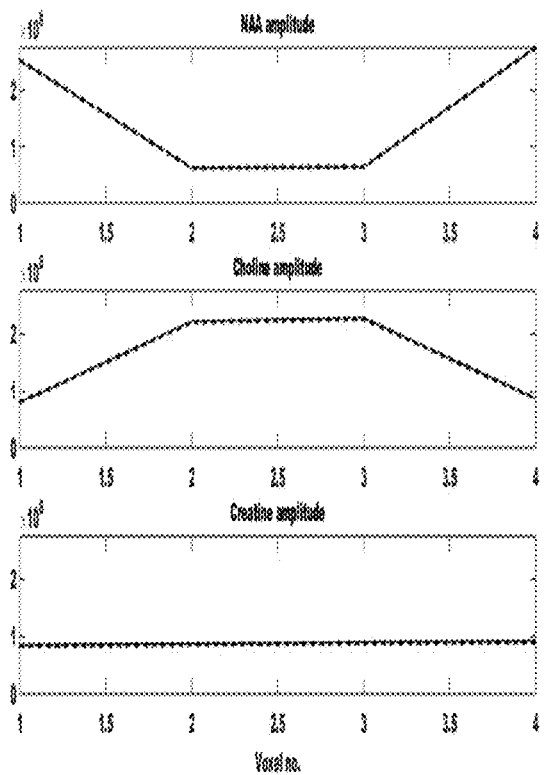
FIG. 13 to FIG. 20 show results of creatine, choline and NAA peaks in a simulation example illustrating embodiments of the present invention.
Figure 14:
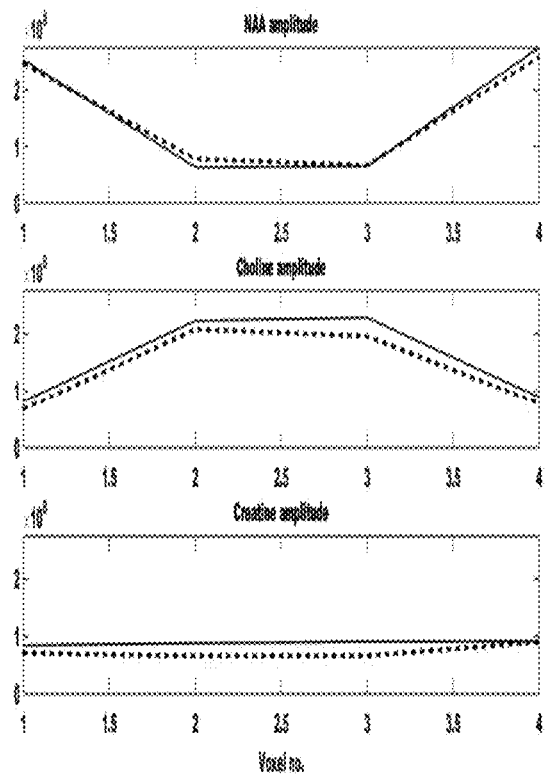
Figure 15:
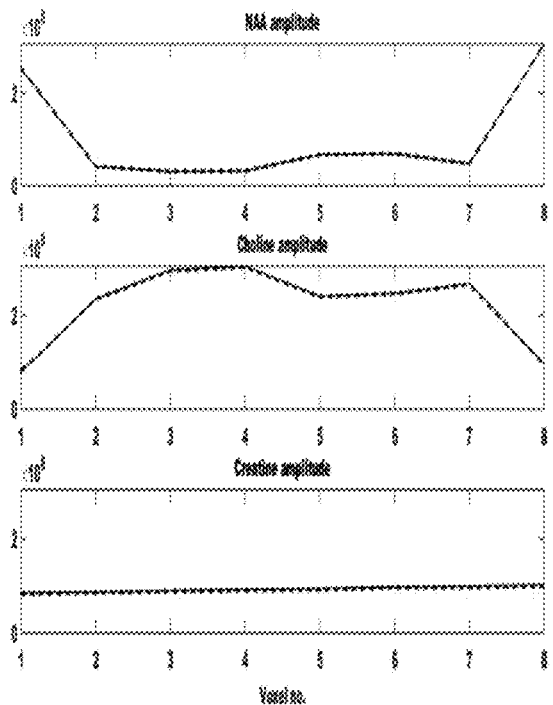
Figure 16:
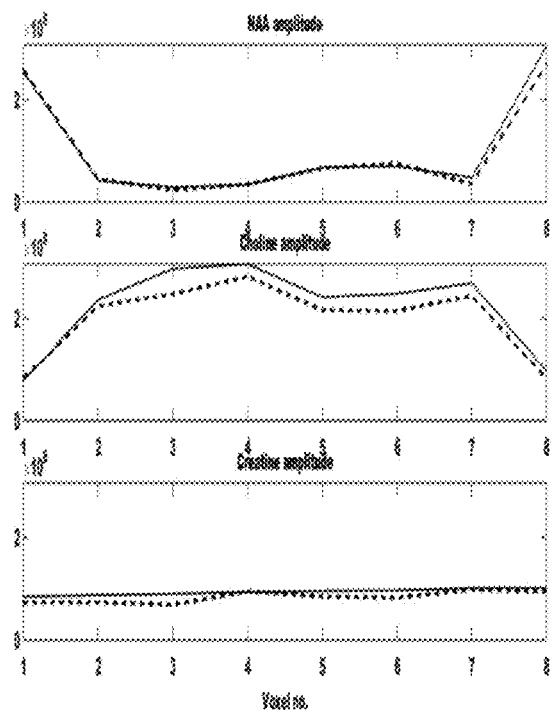
Figure 17:
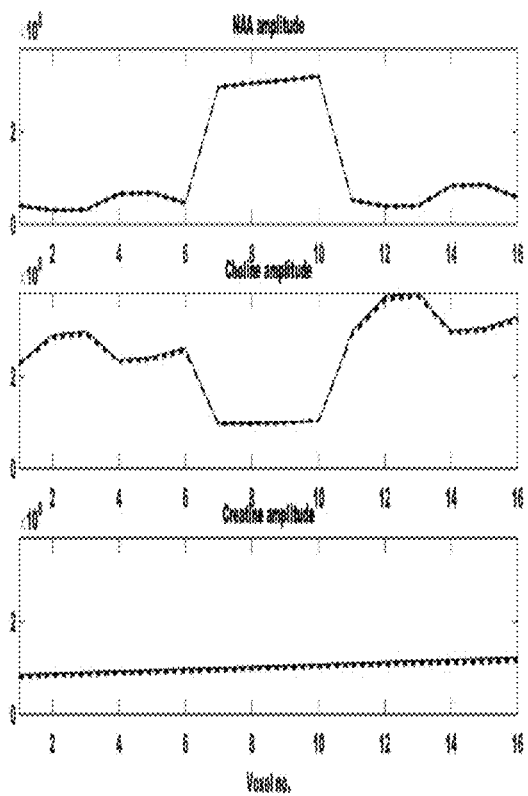
Figure 18:
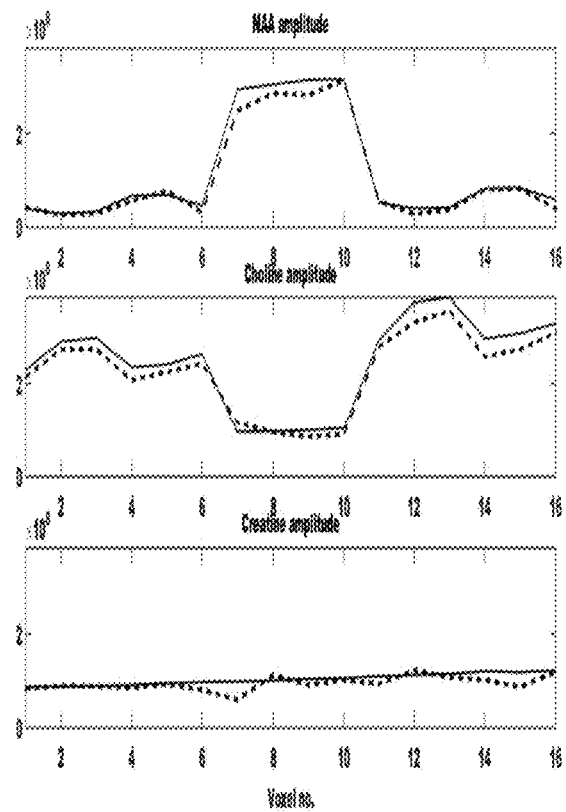
Figure 19:
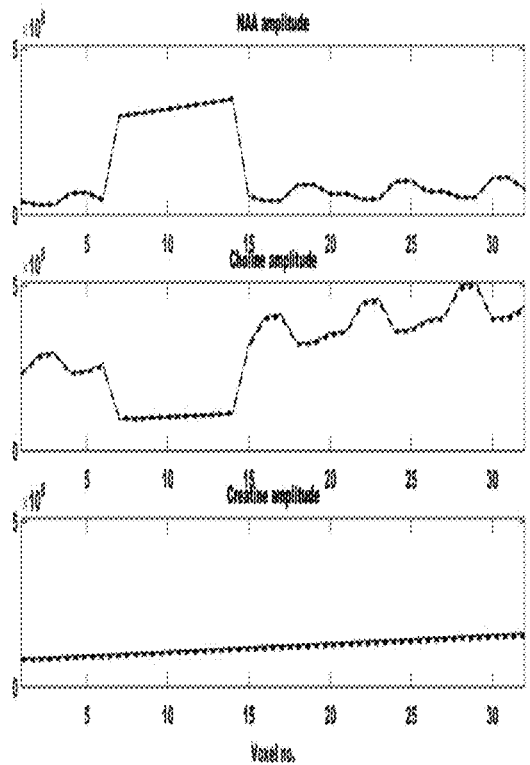
Figure 20:
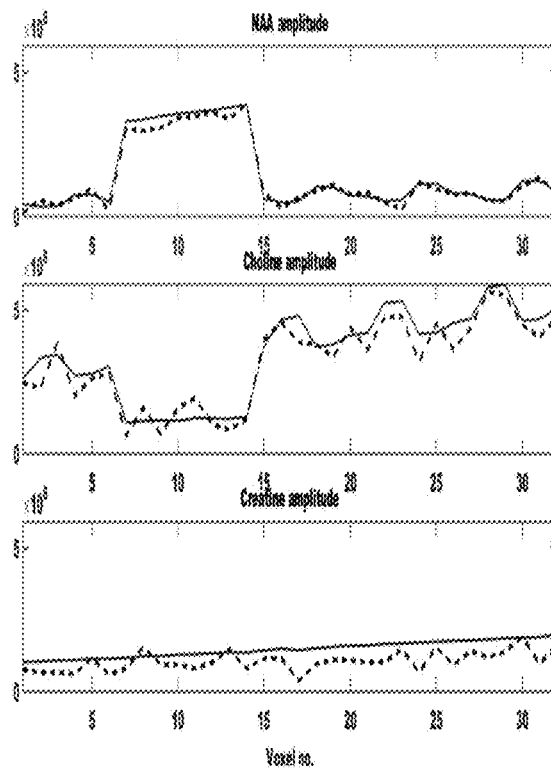
Figure 21:
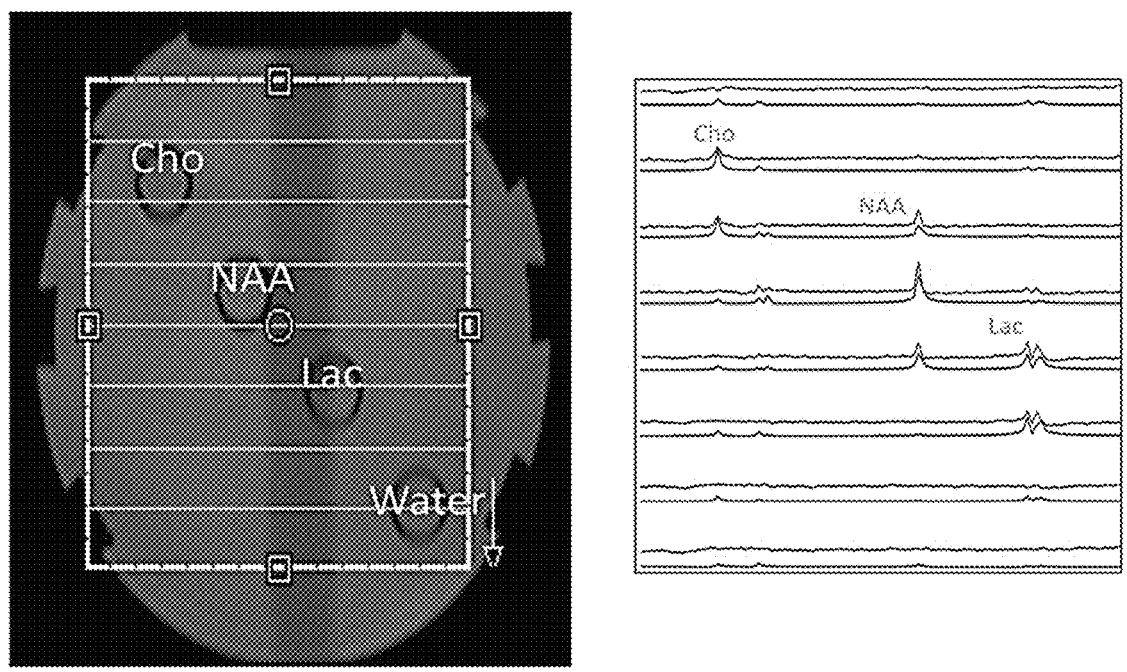
FIG. 21 to FIG. 24 show results of choline, lactate and NAA peaks in a phantom study illustrating embodiments of the present invention. Data are collected with both CSI and RAPID for comparison.

Expected and estimated peak amplitudes of the three main metabolites, creatine, choline and NAA, are shown in these figures. FIG. 13, FIG. 15, FIG. 17 and FIG. 19 correspond to noiseless spectra, while FIG. 14, FIG. 16, FIG. 18 and FIG. 20 correspond to noisy data. FIG. 13 and FIG. 14 correspond to data for PE=4, FIG. 15 and FIG. 16 correspond to data for PE=8, FIG. 17 and FIG. 18 correspond to data for PE=16 and FIG. 19 and FIG. 20 correspond to data for PE=32

The echo acquisition parameters for the simulations performed in this example were: an ADC bandwidth of 2500 Hz, an acquisition time of 204 ms, 512 sample points collected per signal, and one echo acquired per sequence.

These exemplary results demonstrate that the method is able to preserves not only the correct spatial position of the spectra but also their amplitudes values for PE values ranging from 4 to 32. The means and standard deviations of the difference in metabolite peak amplitudes in percentage between the estimated and expected ones calculated as follows:

$$\text{Diff} = \left(\frac{A_{ex} - A_{es}}{A_{ex}}\right)\%$$

Where $A_{ex}$ and $A_{es}$ are the expected and estimated metabolite peak amplitude values respectively. These values are shown in the tables hereinbelow.

For 4 encoding steps:

| Peak | Without noise | | With noise (20 dB) | |
|---|---|---|---|---|
| | Mean | Standard deviation | Mean | Standard deviation |
| NAA | 0.0004 | 0.0001 | 0.08 | 0.09 |
| Choline | 0.005 | 0.003 | 0.10 | 0.04 |
| Creatine | 0.018 | 0.003 | 0.11 | 0.07 |

For 8 encoding steps:

| Peak | Without noise | | With noise (20 dB) | |
|---|---|---|---|---|
| | Mean | Standard deviation | Mean | Standard deviation |
| NAA | 0.004 | 0.002 | 0.10 | 0.088 |
| Choline | 0.006 | 0.003 | 0.106 | 0.047 |
| Creatine | 0.02 | 0.007 | 0.11 | 0.07 |

For 16 encoding steps:

| Peak | Without noise | | With noise (20 dB) | |
|---|---|---|---|---|
| | Mean | Standard deviation | Mean | Standard deviation |
| NAA | 0.004 | 0.004 | 0.129 | 0.10 |
| Choline | 0.017 | 0.006 | 0.10 | 0.04 |
| Creatine | 0.045 | 0.008 | 0.11 | 0.10 |

For 32 encoding steps:

| Peak | Without noise | | With noise (20 dB) | |
|---|---|---|---|---|
| | Mean | Standard deviation | Mean | Standard deviation |
| NAA | 0.02 | 0.015 | 0.17 | 0.19 |
| Choline | 0.033 | 0.012 | 0.166 | 0.14 |
| Creatine | 0.05 | 0.013 | 0.30 | 0.15 |

It can be observed that the data accuracy may slightly drop at high phase encoding steps, which may shorten the sub-echo time duration, and consequently broaden the shapes of the peaks in the frequency. The auto-regression methods described hereinabove may be used to extrapolate the sub-echoes and expand them, e.g. to the time-length of a half echo.

Figure 9:
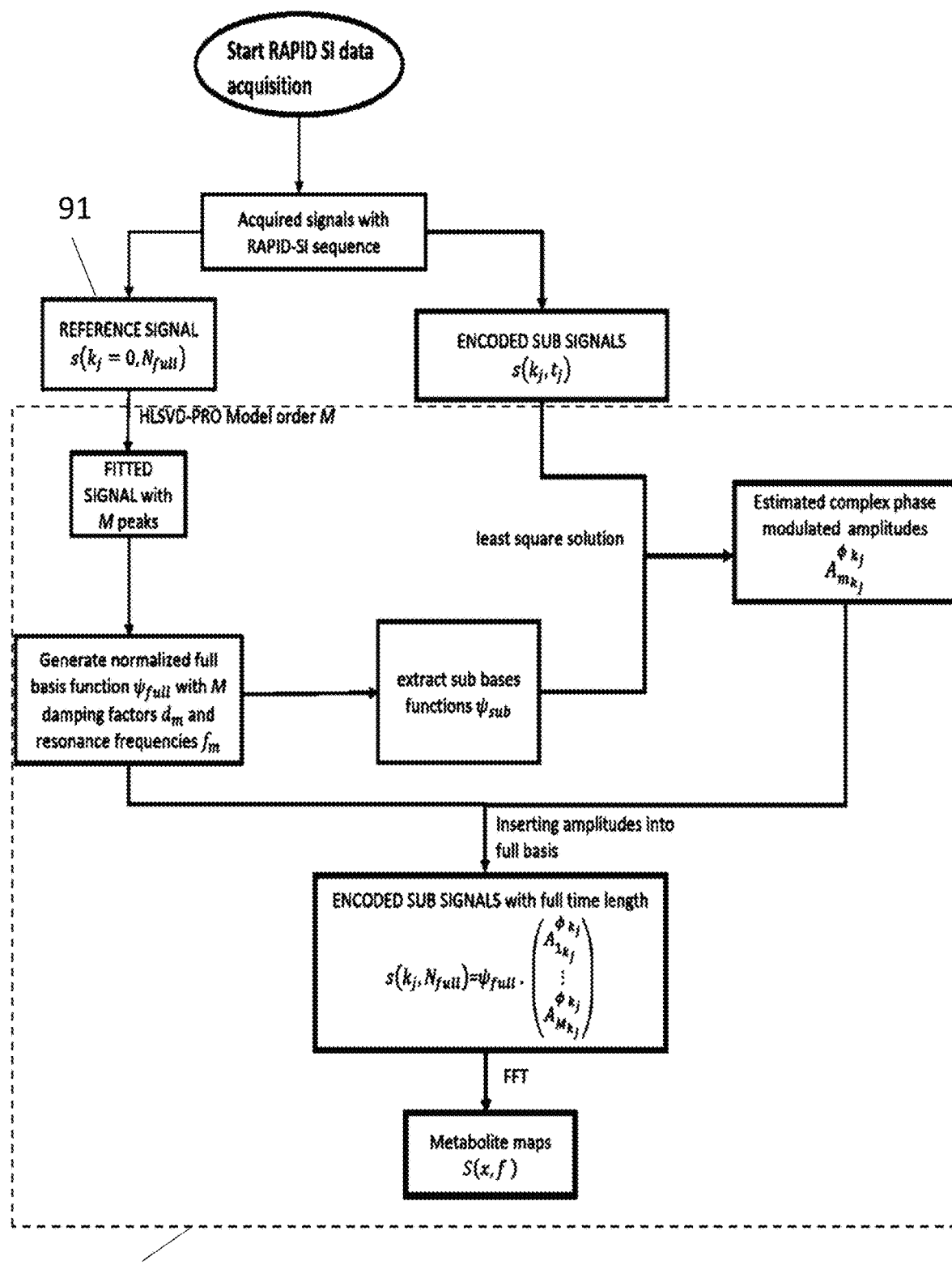
FIG. 9 shows a signal processing step in a method in accordance with embodiments of the present invention.

To show the performance of another method in accordance with embodiments of the present invention, corresponding to the sequence illustrated in FIG. 4 and the processing illustrated in FIG. 9, the sequence, for convenience referred to as RAPID-SI, configured for an acceleration in the anterior-posterior (AP) direction, was implemented on a Siemens Tim-Trio 3T MRI scanner.

The acquired NMR data is processed offline using an in-house Matlab software, in which a HLSVD technique is applied on a full MRS reference signal, e.g. without application of the blipped gradients, e.g. at the centre of k-space ($k_j$=0). The reference signal is acquired prior to the encoding using blipped phase gradient pulses in accordance with embodiments of the present invention. The signal parameters $d_m$, and $f_m$ are estimated from the reference signal, and the sub-bases $\psi_{sub}(m,t_j)$ are determined, e.g. as illustrated by the workflow in FIG. 9. These sub-bases are then used to estimate the complex amplitudes $$A_{m_{k_j}}^{\phi_{k_j}}$$

from the collected sub-signals. A Fourier Transform is performed on both spatial and time domains to obtain the spatial distribution of the spectra. A Hamming filter is applied in the spatial domain to reduce voxel contamination.

To accurately estimate signal parameters using the HLSVD approach, the duration of the acquisition window is set to the average $T^*_2$ values of the main brain metabolites (NAA, Creatine, Choline, Myo-inositol, and lactates) obtained at 3 Tesla, which was found to be approximately 250 ms, and given the receiver bandwidth set to 1600 Hz, the adequate total number of points $N_{full}$ for the highest R possible, was found to be 512. This is confirmed by 1D RAPID-SI tests performed on phantoms using different $N_{full}$ values described further hereinbelow.

Tubes were filled with brain metabolites solutions (Cho, NAA and lactate) having known concentrations and are placed inside a cylindrical water solution phantom, used to acquire 1D and 2D RAPID-SI and CSI data sets using the following acquisition parameters: TE=35 ms, TR=2000 ms, BW=1600 Hz, N=512, $N_{avg}$=2. The FOV dimensions are AP=100 mm, HF=10 mm, whereas RL is set to 55 mm for 1D and to 100 mm for 2D acquisitions. The spatial resolution is varied from 1×4, 1×8 and 1×16 for the 1D data sets and from 4×4, 8×8, to 16×16, for the 2D data sets. The acceleration factor ranges from 4 to 8 depending the data size.

To check the accuracy on the RAPID-SI data, absolute quantification results from the voxels covering the tubes of the metabolites are calculated using the equation below:

$$C_{metabolite} = C_{water} \cdot \left(\frac{2}{np}\right) \cdot \left(\frac{A_{metabolite}}{A_{water}}\right) \cdot \frac{\exp\left(\frac{TE}{T2_{metabolite}}\right)}{\exp\left(\frac{TE}{T2_{water}}\right)} \cdot \frac{\left\{1 - \exp\left(\frac{-TR}{T1_{water}}\right)\right\}}{\left\{1 - \exp\left(\frac{-TR}{T1_{metabolite}}\right)\right\}}$$

and compared to those obtained from the full reference spectrum which contains metabolite peaks signals from all the tubes of the phantom. The variable $C_{metabolite}$ is the metabolite concentration (mM), $C_{water}$ is the water concentration used as internal reference (110 M), $A_{metabolite}$ is the area under the metabolite peak calculated using the HLSVD approach, $A_{water}$ is the area under the water peak calculated from the unsupressed water data, np is the number of protons in a given metabolite, and $T1_{metabolite}$, $T2_{metabolite}$, $T1_{water}$, $T2_{water}$ are the relaxation times of metabolite and water respectively. Metabolite maps for both RAPID-SI and CSI methods are calculated, and voxel bleed are calculated and compared.

From the obtained 1D RAPID-SI spectra, acquired with different $N_{full}$ values at different spatial resolutions, $N_{full}$ set to 512 is found to be a good compromise between data acceleration, SNR, and accurate signal parameter estimation. With this setting, the highest acceleration factor R reached the value of 8, while high spectral resolution, e.g. better separation between the lactate doublet, and SNR values are obtained.

Compared to CSI, the RAPID-SI reduces the acquisition time by R, which is ranging from 4 to 8, given the spatial resolution varying from 4 to 16. A 16×16 data acquired in around 17 min with CSI, given the setting above, is reduced to about 2 min with the RAPID-SI. The table hereinbelow summarizes acquisition times for both techniques at different spatial resolutions.

| Acquisition time | (1 × 4) R = 4 | (1 × 8) R = 8 | (1 × 16) R = 8 | (4 × 4) R = 4 | (8 × 8) R = 8 | (16 × 16) R = 8 |
|---|---|---|---|---|---|---|
| CSI | 16 s | 32 s | 64 s | 64 s | 256 s | 1024 s |
| RAPID | 4 s | 4 s | 4 s | 16 s | 32 s | 128 s |

In terms of data quantification, RAPID-SI provides accurate results. The table hereinbelow shows the estimated concentration values vs. the expected ones from the following phantom data sets.

| Concentration (mM) | NAA | Lac (contamination per voxel %) | Cho |
|---|---|---|---|
| Expected | 25 | 17 | 7 |
| CSI (4 × 4) | 26 | 17.88 (0.2%) | 6.53 |
| RAPID (4 × 4) | 26.2 | 18 (0.4%) | 7.68 |
| CSI (8 × 8) | 23 | 17 (0.02%) | 6 |
| RAPID (8 × 8) | 27 | 17.14 (0.04%) | 7.20 |
| CSI (16 × 16) | 22 | 16 (0.2%) | 7.8 |
| RAPID (16 × 16) | 22 | 16.70 (1.2%) | 8 |

A qualitative comparison of the 1D and 2D RAPID-SI results displayed in FIGS. 21 to 24 shows a very good match to the corresponding CSI results. However, from the figures above, one can notice that voxel contamination in RAPID-SI is slightly higher than CSI, especially for the lactate doublet. This contamination is 0.2% per voxel in the 16×16 results for the CSI and increases to 1.2% per voxel for the RAPID-SI. This is due to the overestimation of the $$A_{m_k^j}^{\phi_k^j}$$

values of the lactate doublet, which appear as singlet in the collected sub-signals caused by the decrease in the spectral resolution. Therefore, a more reliable post-processing may be preferable to better estimate these complex amplitudes to reduce voxel contamination. Voxel contamination is calculated by dividing the amplitude of any metabolite detected in any voxel by its amplitude in the expected voxel.

Figure 22:
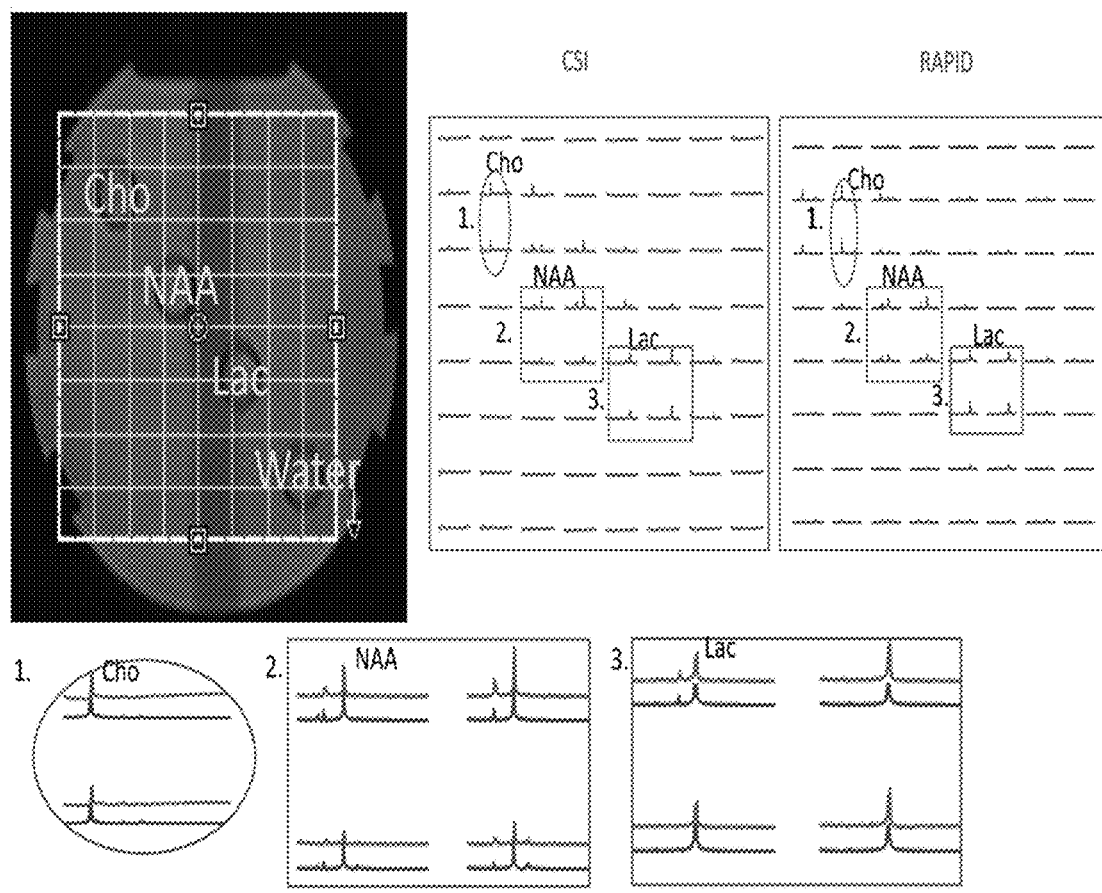
Figure 23:
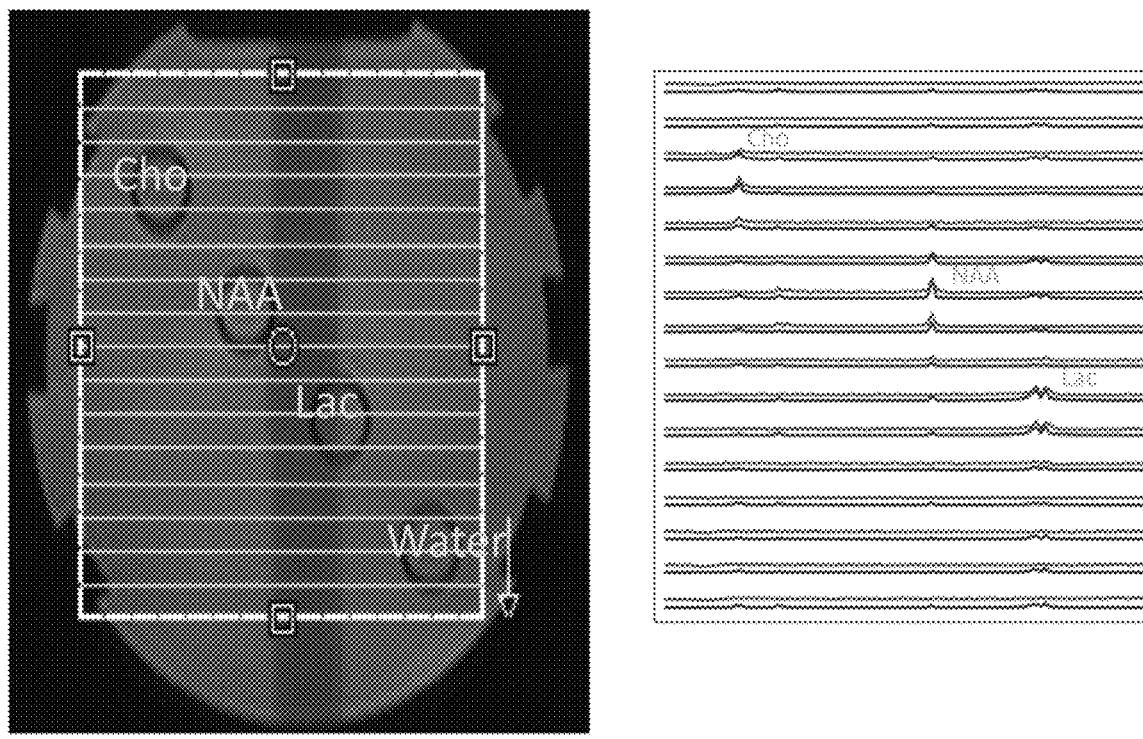
Figure 24:
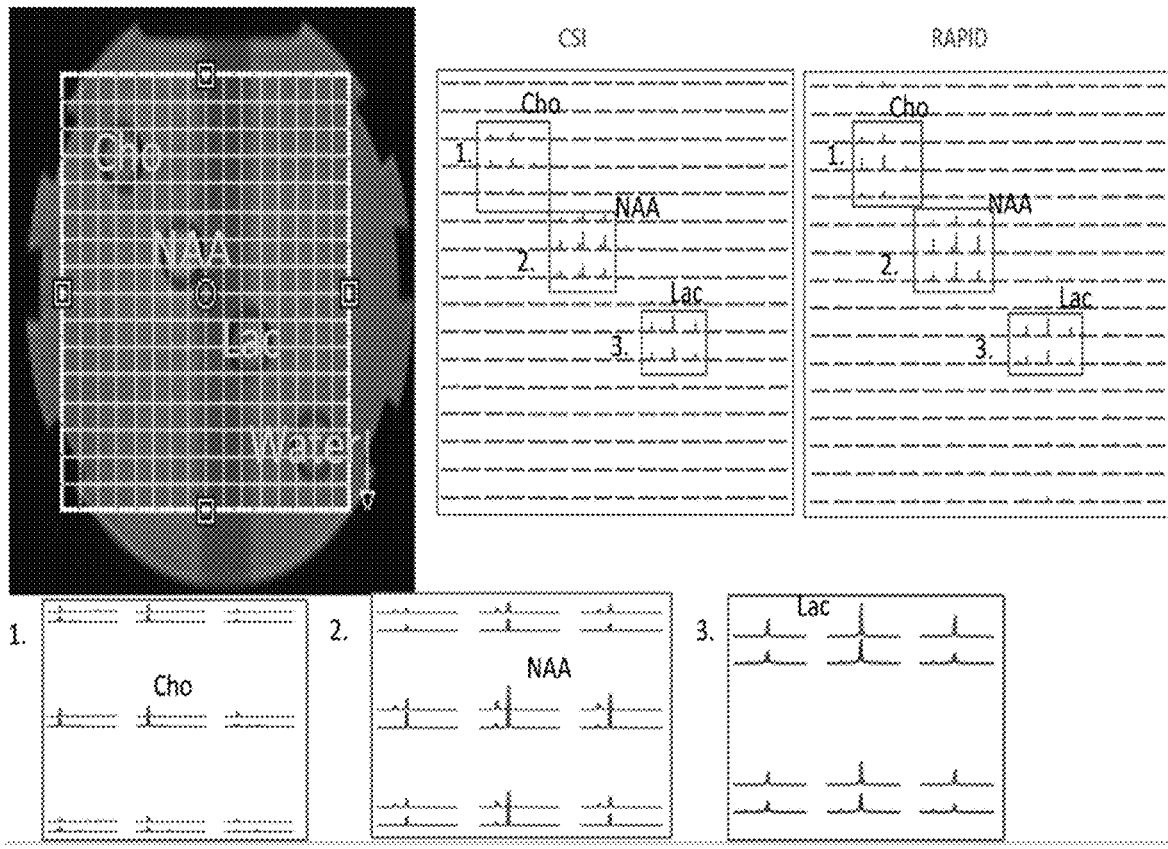

As expected, the overall SNR is lower in RAPID-SI than CSI by approximately the factor √R in the 4×4, 8×8, and 16×16, results when processing reduced size sub-signals only, e.g. see the table hereinbelow. These values, however, are increased in the fully reconstructed data as shown in FIG. 22 and FIG. 24. The SNR is calculated as the ratio of the NAA peak intensity and the standard deviation of noise. It is to be noted that the encoding efficiency of the metabolite signals is subject to their $T^*_2$ values. Given that the whole k space is filled within the duration of the acquisition window, the number of k space data points used to spatially encode each metabolite signal is proportional to its corresponding $T^*_2$ value. Signal components with long $T^*_2$ are sampled by several data points in k space, whereas those with short $T^*_2$ have less points to characterize them. This may cause a spatial blurring of the of metabolite maps with short $T^*_2$. To overcome this problem, a deconvolution between sinc-like functions with width at half maximum (WHM) inversely proportional to the $T^*_2$ values of the blurred metabolite signals and their corresponding maps is performed to recover the original spatial distribution of the metabolites.

| | SNR | | |
|---|---|---|---|
| | (4 × 4) R = 4 | (8 × 8) R = 8 | (16 × 16) R = 8 |
| CSI | 32 | 35.6 | 36 |
| RAPID | 15 | 12.8 | 12.6 |

While present examples relate to tests performed with Cartesian k-space trajectories, embodiments of the present invention are not limited thereto, e.g. other k-space paths may be implemented in a method in accordance with embodiments of the present invention. A method in accordance with embodiments can advantageously be integrated into many localized MRS sequences as known in the art that generate an FID or echo signal, e.g. PRESS or STEAM. Furthermore, a method in accordance with embodiments of the present invention can be combined with other acceleration methods, such as parallel imaging, compressed sensing and/or the complex conjugate principle.

In conclusion, a method in accordance with embodiments of the present invention may use a partition of the acquired MRS signal into encoded sub-signals by inserting blipped gradients in a predetermined, e.g. selected, direction. A method in accordance with embodiments may provide MRSI results with a good balance between SNR, spectral resolution and acquisition time. For example, compared to CSI, a RAPID-SI approach may achieve a significant time reduction in acquiring accurate metabolite maps. Even though an SNR decrease may be implied, this can be compensated by a signal processing in accordance with embodiments of the present invention to reduce the noise contribution and to estimate the signal parameters.

The invention claimed is:
1. A method for performing nuclear magnetic resonance spectroscopy, the method comprising the steps of:
   positioning a sample in a homogeneous stationary magnetic field directed along an axis;

preparing nuclei in at least a predetermined volume of said sample for resonant emission of an NMR signal and creating said NMR signal, in which said preparing and creating comprises irradiating said sample with at least one radio-frequency excitation pulse in accordance with an MRI sequence preparation module and/or an MRI sequence evolution module; and sensing said NMR signal in the absence of frequency encoding magnetic field gradients such that analysis of said NMR signal yields a chemical shift spectrum from said nuclei;

wherein, during said sensing, a plurality of intermittently blipped phase gradient pulses are applied to incrementally shift a position in k-space such that different time segments of said NMR signal, demarcated by said blipped phase gradient pulses, correspond to different predetermined locations in k-space.

2. The method of claim 1, wherein each of said plurality of intermittently blipped gradient pulses has a pulse width in the range of 1 µs to 10 µs.

3. The method of claim 1, wherein said plurality of intermittently blipped gradient pulses have a same pulse amplitude, wherein said plurality of intermittently blipped gradient pulses are spaced apart in time at regular time intervals, said time interval being smaller than a fourth of the duration of said NMR signal.

4. The method of claim 1, wherein said preparing of the at least one predetermined volume in the sample comprises irradiating said sample with at least one radio-frequency excitation pulse in accordance with an MRI sequence preparation module to prepare said at least one predetermined volume in the form of a predetermined imaging slice.

5. The method of claim 1, wherein said creating of said NMR signal comprises irradiating said sample with at least one radio-frequency refocusing pulse in accordance with an MRI sequence evolution module so as to invert spins of said nuclei, thereby creating said NMR signal in the form of at least part of an echo signal.

6. The method of claim 5, wherein said preparing and/or creating comprises irradiating the sample with at least three selective radiofrequency pulses while simultaneously applying magnetic field gradients, such as to select the predetermined volume at a predetermined location in the sample in accordance with a point resolved spectroscopy or stimulated echo acquisition mode MRI sequence.

7. The method of claim 1, further comprising applying a further blipped phase gradient pulse before creating said NMR signal to shift a k-space location corresponding to the first sensed time segment of said plurality of time segments to a peripheral region of k-space.

8. The method of claim 1, wherein said preparing and/or creating further comprises applying an MRI sequence module for water signal suppression and/or water signal elimination.

9. The method of claim 1, further comprising repeating at least the step of creating the NMR signal to create at least one further NMR signal and the step of sensing the at least one further NMR signal, said NMR signal and said or each at least one further NMR signal corresponding to a different predetermined volume in said sample.

10. The method of claim 1, further comprising, for each of said different time segments of said NMR signal, performing a signal processing step for extending said time segment in time over at least half of the time interval as said NMR signal was sensed.

11. The method of claim 10, further comprising a step of computing a complex conjugate of each extrapolated NMR signal to obtain a conjugated extrapolated NMR signal representative of a mirror location in k-space.

12. The method of claim 10, further comprising, for each of said different time segments of said NMR signal, extrapolating said time segment of the NMR signal in a forward sense and/or a backward sense of time such as to obtain an extrapolated NMR signal, representative of the location in k-space corresponding to said time segment, that is extrapolated over at least half of the time interval as said NMR signal was sensed, in which said extrapolating comprises applying an autoregressive model or generalized autoregressive model to extrapolate said time segment of the NMR segment in said forward sense of time and/or in said backward sense of time.

13. The method of claim 10, furthermore comprising acquiring a reference signal without applying said blipped phase gradient pulses during said acquisition of said reference signal.

14. The method of claim 13, wherein said signal processing step comprises estimating parameters of a predetermined plurality of spectral peaks, said parameters being substantially constant over the time segments, by fitting said reference signal to a signal model representative of said plurality of spectral peaks.

15. The method of claim 14, wherein said parameters comprise a frequency and a damping factor for each of said plurality of spectral peaks.

16. The method of claim 14, wherein said signal processing further comprises using said estimated parameters to generate a noiseless basis representing the predetermined spectral peaks, partitioning said basis into time segments of the basis corresponding to the time segments of said NMR signal and fitting each time segment of the NMR signal to a linear combination of the time segments of the basis to determine complex valued coefficients representative of phase modulated amplitudes of the predetermined plurality of spectral peaks for each time segment.

17. The method of claim 16, comprising extending each time segment in time by using the linear combination of said noiseless basis that corresponds to the complex valued coefficients determined for the time segment as the extended time segment and/or as an extrapolated time segment.

18. The method of claim 1, further comprising applying a Fourier transform to said time segments, or to extrapolated NMR signals, of both k-space and time domain dimensions, to provide chemical species spectra as function of spatial location in the sample.

19. The method of claim 1, further comprising obtaining an image of the sample representative of spatial variations in a chemical constitution of the sample and storing said image in a data storage memory.

20. A control unit comprising a controller configured for controlling a magnetic resonance scanner such as to perform the steps of a method according to claim 1.

* * * * *